(12) United States Patent
Sato et al.

(10) Patent No.: US 7,700,460 B2
(45) Date of Patent: *Apr. 20, 2010

(54) SEMICONDUCTOR DEVICE FABRICATION METHOD AND ELECTRONIC DEVICE FABRICATION METHOD

(75) Inventors: Mitsuru Sato, Suwa (JP); Sumio Utsunomiya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 216 days.

This patent is subject to a terminal disclaimer.

(21) Appl. No.: 11/594,061

(22) Filed: Nov. 8, 2006

(65) Prior Publication Data

US 2007/0111450 A1    May 17, 2007

(30) Foreign Application Priority Data

Nov. 14, 2005   (JP)   ............................... 2005-329205
Oct. 11, 2006   (JP)   ............................... 2006-277889

(51) Int. Cl.
  *H01L 21/20*   (2006.01)
(52) U.S. Cl. ...................... 438/479; 438/486; 438/689; 438/715; 438/796; 257/E21.119; 257/E21.497
(58) Field of Classification Search ................ 438/479, 438/486, 689, 715, 796; 257/E21.119, E21.497
  See application file for complete search history.

(56) References Cited

U.S. PATENT DOCUMENTS 3,272,591 A * 9/1966 Rudness et al. ............... 117/12
3,876,382 A * 4/1975 Falckenberg ................ 117/207
3,917,459 A * 11/1975 Falckenberg et al. ........ 117/207
5,314,847 A   5/1994 Watanabe et al.
5,786,277 A   7/1998 Yamamoto
6,130,397 A   10/2000 Arai
6,187,616 B1   2/2001 Gyoda
6,505,484 B1 * 1/2003 Fujiwara et al. ................ 65/66
7,514,306 B2 * 4/2009 Utsunomiya ................ 438/166

(Continued)

FOREIGN PATENT DOCUMENTS

CN   1161569 A   10/1997

(Continued)

OTHER PUBLICATIONS

Higashi S. et al., "Crystallization of Si Thin Film Using Thermal Plasma Jet and Its Application to Thin-Film Transistor Fabrication," AM-LCD, 2004, Technical Digest Papers, p. 179.

*Primary Examiner*—Michael S Lebentritt
(74) *Attorney, Agent, or Firm*—Oliff & Berridge, PLC

(57) ABSTRACT

The present invention provides a semiconductor device fabrication method capable of reducing the thermal load on the substrate. The present invention also provides a semiconductor device fabrication method capable of improving the characteristics of a semiconductor element. The semiconductor device fabrication method according to the present invention comprises a step of thermally processing a semiconductor layer that is deposited on a substrate by using, as a heat source, the flame of a gas burner that uses a mixed gas of hydrogen and oxygen as fuel. As a result of thermal processing, the semiconductor layer is re-crystallized and an oxide film is formed on the surface of the semiconductor layer. The oxide film can be used as a gate insulation film and a capacitive insulation film.

18 Claims, 17 Drawing Sheets

U.S. PATENT DOCUMENTS

| | | | |
|---|---|---|---|
| 2004/0155244 A1 | 8/2004 | Kawata et al. | |
| 2006/0223328 A1* | 10/2006 | Utsunomiya et al. | 438/715 |
| 2007/0232034 A1* | 10/2007 | Utsunomiya | 438/486 |
| 2008/0087213 A1* | 4/2008 | Sato et al. | 118/47 |
| 2008/0090388 A1* | 4/2008 | Sato et al. | 438/479 |

FOREIGN PATENT DOCUMENTS

| | | |
|---|---|---|
| CN | 1263636 A | 8/2000 |
| CN | 1518129 A | 8/2004 |
| JP | A-56-137643 | 10/1981 |
| JP | A 04-284630 | 10/1992 |
| JP | A 06-13407 | 1/1994 |
| JP | A-06-069127 | 3/1994 |
| JP | A-6-302511 | 10/1994 |
| JP | H08-008255 B | 1/1996 |
| JP | A 11-135492 | 5/1999 |
| JP | A 11-145148 | 5/1999 |
| JP | A-2003-130315 | 5/2003 |
| JP | A-2003-197618 | 7/2003 |
| KR | 94-010509 | 1/1992 |

* cited by examiner

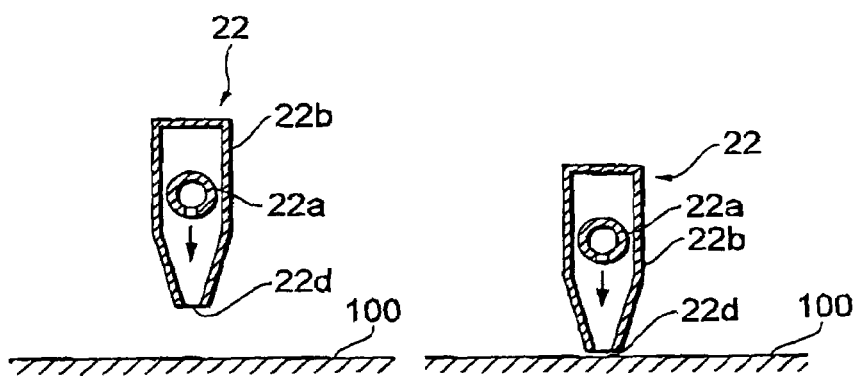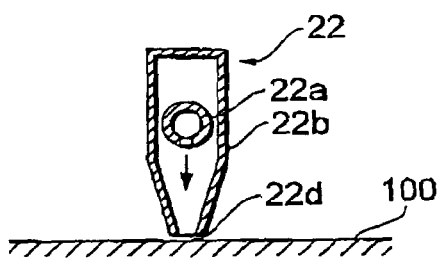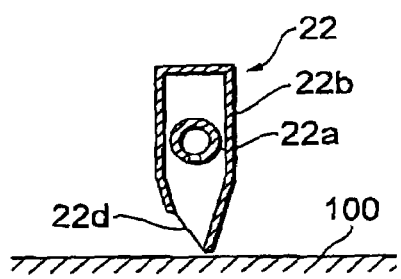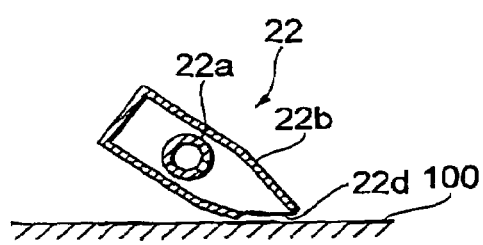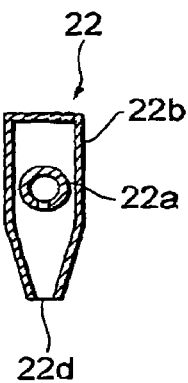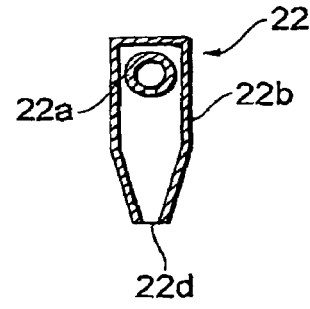

Fig.11

| SAMPLE | Gap [mm] | SCANNING SPEED [mm/s] | MAXIMUM TEMPERATURE [°C] | Si FILM THICKNESS [μm] | SiO₂ FILM THICKNESS [μm] |
|---|---|---|---|---|---|
| A | 50 | 62 | 713 | 0.051 | 0.004 |
| B | 50 | 50 | 722 | 0.051 | 0.004 |
| C | 30 | 98 | 709 | 0.0505 | 0.0035 |
| D | 30 | 65 | 756 | 0.051 | 0.004 |
| E | 30 | 38 | 889 | 0.04 | 0.009 |

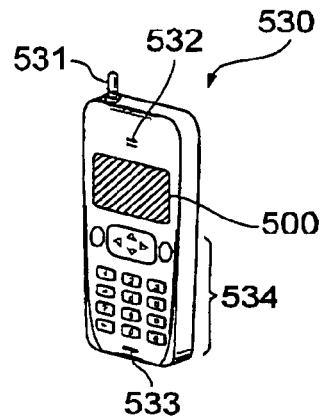
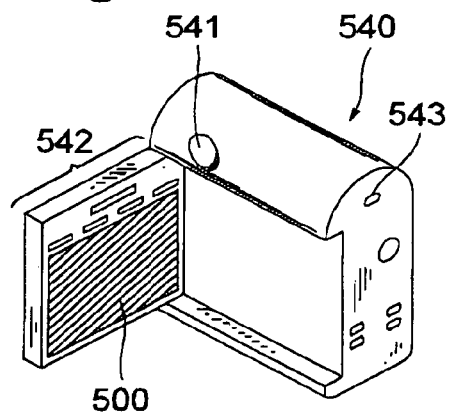
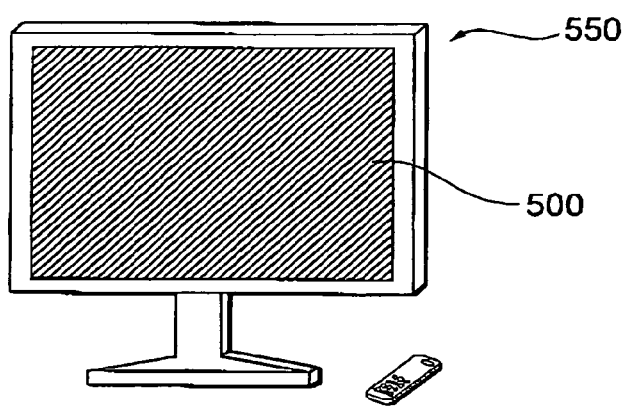
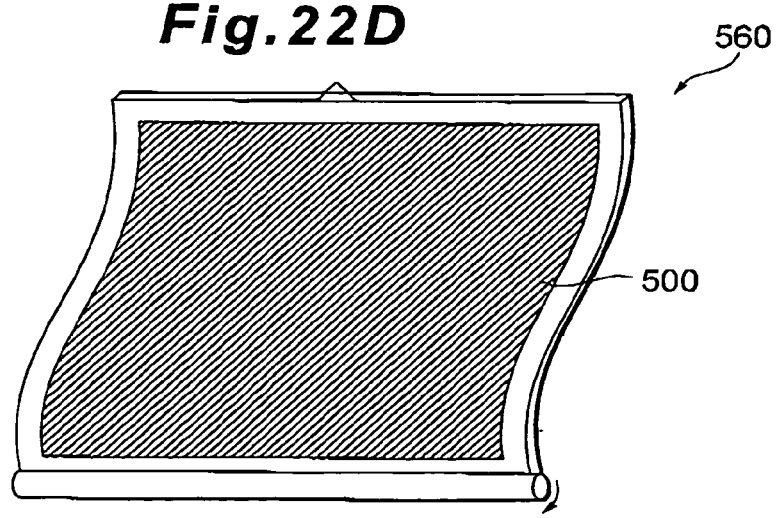

SEMICONDUCTOR DEVICE FABRICATION METHOD AND ELECTRONIC DEVICE FABRICATION METHOD

CROSS-REFERENCES TO RELATED APPLICATIONS

The entire disclosure of Japanese Patent Application No. 2005-329205, filed on Nov. 14, 2005 and Japanese Patent Application No. 2006-277889, filed on Oct. 11, 2005 is expressly incorporated herein by reference.

BACKGROUND

The present invention relates to a semiconductor device fabrication method and an electronic device fabrication method. Crystallization methods that re-crystallize silicon that is deposited on a substrate by CVD (Chemical Vapor Deposition) or the like include a solid phase grown method that uses high temperature thermal processing at 600 to 1000° C., a laser annealing method that performs excimer laser irradiation, and a thermal plasma jet method (Japanese Patent Application Nos. H11-145148 and Crystallization of Si Thin Film Using Thermal Plasma Jet and Its Application to Thin-Film Transistor Fabrication, S. Higashi, AM-LCD '04 Technical Digest Papers, p. 179) that has thermal plasma as its heat source).

Further, methods that are used as methods of forming an oxide film as an insulation film on a re-crystallized silicon film include thermal oxidation film methods (dry oxygen oxidation, wet oxidation, steam oxidation, and hydrogen combustion oxidation), CVD (TEOS, PECVD), and sputtering and so forth).

A method that processes an oxide film by means of high-pressure steam annealing is known as a method for improving the film quality of the oxide film thus formed (Japanese Patent Application Laid Open Nos. H6-13407, H11-135492, and H4-284630, for example).

However, in the solid phase growth method using thermal processing mentioned above, because the substrate is heated to a maximum temperature of 600 to 1000° C., a low-cost glass substrate cannot be used. Further, the thermal load on the substrate is large and bending and cracking and so forth of the substrate readily occurs. In addition, crystallization takes a long time and productivity is limited. Moreover, although, with laser annealing, a glass substrate of low heat resistance can be used, high-cost equipment is required and there is a tendency for variations in the element characteristic to increase. Further, the thermal plasma jet method is also costly.

On the other hand, the present inventor targeted research on thermal processing by applying the flame of a gas burner that has a mixed gas of hydrogen and oxygen as its fuel (See Japanese Patent Application No. 2005-329205, for example) as a semiconductor device fabrication method that is able to reduce the thermal load on the substrate and perform thermal processing of a large-area substrate and intensely studied processes and conditions and so forth for obtaining a favorable semiconductor device in the course of this research.

SUMMARY

Accordingly, an object of the present invention is to provide a semiconductor device fabrication method that allows the thermal load on the substrate to be reduced. Further, an object of the present invention is to provide a semiconductor device fabrication method that allows the characteristics of the semiconductor element to be improved.

(1) The semiconductor device fabrication method according to the present invention comprises the step of thermally processing a semiconductor layer that is deposited on a substrate by using, as a heat source, the flame of a gas burner that uses a mixed gas of hydrogen and oxygen as fuel, wherein the semiconductor layer is re-crystallized by the thermal processing and an oxide film is formed on the surface of the semiconductor layer.

According to this method, the re-crystallization of the semiconductor layer can be performed by the flame of the gas burner. Further, it is possible to bring about coupling of the dangling bonds of the semiconductor layer and hydrogen or oxygen atoms by means of reactive activated species generated by combustion (oxygen radicals, hydrogen radicals, and hydroxyl radicals and so forth). As a result, the electrical charge trap density is reduced and the characteristics of the semiconductor layer can be improved. Further, usage of the oxide film that is formed during crystallization of the semiconductor layer is permitted, whereby simplification of the fabrication steps is possible.

(2) The fabrication method of the semiconductor device according to the present invention comprises the steps of thermally processing a semiconductor layer that is deposited on a substrate by using, as a heat source, the flame of a gas burner that uses a mixed gas of hydrogen and oxygen as fuel such that the semiconductor layer is re-crystallized and an oxide film is formed on the surface of the semiconductor layer; and forming an electrically conductive film on the oxide film.

According to this method, re-crystallization of the semiconductor layer can be performed by means of the flame of a gas burner. Further, it is possible to bring about coupling of the dangling bonds of the semiconductor layer and hydrogen or oxygen atoms by means of reactive activated species generated by combustion (oxygen radicals, hydrogen radicals, and hydroxyl radicals and so forth). As a result, the electrical charge trap density is reduced and the characteristics of the semiconductor layer can be improved. Further, usage of the oxide film that is formed during crystallization of the semiconductor layer is permitted, whereby simplification of the fabrication steps is possible. A semiconductor element such as a TFT or capacitor, for example, can be formed by forming a conductive film on the oxide film.

The fabrication method further comprises a step of forming an insulation film on the oxide film, for example. Thus, when there is only an oxide film, the insulation film may also be formed when the oxide film constituting the semiconductor element is thin.

(3) The fabrication method of the semiconductor device according to the present invention is a semiconductor device fabrication method, comprising the steps of thermally processing a semiconductor layer that is deposited on a substrate by using, as a heat source, the flame of a gas burner that uses a mixed gas of hydrogen and oxygen as fuel such that the semiconductor layer is re-crystallized and an oxynitride film is formed on the surface of the semiconductor layer; and forming an electrically conductive film on the oxynitride film.

According to this method, re-crystallization of the semiconductor layer can be performed by means of the flame of a gas burner. Further, it is possible to bring about coupling of the dangling bonds of the semiconductor layer and hydrogen or oxygen atoms by means of reactive activated species generated by combustion (oxygen radicals, hydrogen radicals, and hydroxyl radicals and so forth). As a result, the electrical charge trap density is reduced and the characteristics of the semiconductor layer can be improved. Further, an oxynitride film which is a compact film with a higher conductivity than an oxide film can be made to remain on the surface of the semiconductor layer by devising a thermal processing condition such that the oxynitride film is formed when re-crystallizing the semiconductor layer. Accordingly, the characteristic of the element can be improved by using the oxynitride film as a portion of the semiconductor element (TFT or capacitor or the like, for example). Further, the fabrication steps can also be simplified. The semiconductor element can be formed, for example, by forming an electrically conductive film on the oxynitride film.

For example, the thermal processing that is performed under this condition is performed by including nitrogen in the mixed gas of hydrogen and oxygen, or performed in a nitrogen atmosphere. According to this method, an oxynitride film can be formed efficiently on the surface of the semiconductor layer.

For example, the oxide film or oxynitride film is a gate insulation film and the electrically conductive film is a gate electrode. According to this method, the TFT fabrication steps can be simplified and the TFT characteristics can be improved.

For example, the oxide film or oxynitride film is a capacitive insulation film and the electrically conductive film is a capacitive electrode. According to this method, the fabrication method for the capacitive element can be simplified and the characteristics of the capacitive element can be improved.

For example, the fabrication method may comprise the steps of removing the oxide film and forming another insulation film on the surface of the semiconductor layer. Thus, the oxide film formed during re-crystallization of the semiconductor layer may be removed and another insulating layer may be formed.

For example; the thermal processing is performed by establishing an oxygen-rich gas mixture of hydrogen and oxygen. According to this method, the formation of the oxide film can be promoted.

For example, thermal processing is performed by establishing a hydrogen-rich mixed gas of hydrogen and oxygen after the thermal processing performed under the conditions, and further comprises thermal processing that performs reforming of the semiconductor layer and oxide film. According to this method, the dangling bonds of the semiconductor layer are depleted by the hydrogen atoms, whereby the charge trap density can be reduced. Further, the crystal defects that are readily produced at the interface between the oxide film and semiconductor layer in particular are reduced by the hydrogen and the interface state density between the semiconductor layer and oxide film is also reduced.

For example, a patterning step is performed by etching the semiconductor layer deposited on the substrate prior to the thermal processing step. According to this method, re-crystallization of the semiconductor layer with the desired pattern can be performed. In addition, an oxide film can be formed on the sides of the semiconductor layer and the semiconductor layer can be covered by the oxide film.

For example, the thermal processing is performed by forming the flame of the gas burner with a linear shape and scanning the semiconductor layer relatively by means of the linear-shaped flame. This method allows a large-area semiconductor substrate to be efficiently thermally processed.

For example, the temperature or pressure of the flame to which the semiconductor layer is exposed is adjusted by adjusting the distance between the gas burner and the substrate. This method allows the thermal processing conditions to be adjusted easily.

For example, the pressure of the flame to which the semiconductor layer is exposed is adjusted by adjusting the attitude of the gas burner with respect to the substrate. According to this method, the thermal processing conditions can be easily adjusted.

The gas burner is constituted comprising an air guide pipe that leads out the mixed gas, and a shield device that comprises a combustion chamber that causes the mixed gas to combust by covering the air guide pipe and a nozzle section that emits the combustion gas. According to the method, the emission state of the combustion gas (flame) can be controlled by the nozzle.

For example, a plurality of openings are formed at a fixed pitch in the air guide pipe and a flame is radiated from the openings. According to this method, a large-area semiconductor substrate can be thermally processed efficiently. Further, a larger substrate can be easily accommodated by extending the air guide pipe and increasing the openings.

For example, the temperature of the flame is adjusted by adding an inert gas to the mixed gas of hydrogen and oxygen. According to this method, the range of adjustment of the combustion temperature and the pressure of the gas emitted from the nozzle increases as a result of adding the inert gas.

For example, the substrate and gas burner are disposed in a chamber, and the pressure in the chamber is adjusted by introducing an inert gas to the chamber. According to this method, oxidation (the oxidation speed) of the semiconductor layer can be suppressed by the step of introducing the inert gas.

For example, the fabrication method comprises a step of heating the substrate before the thermal processing and/or during the thermal processing. According to this method, heat shock caused by the temperature difference between the flame radiation section and the whole substrate (bulk) can be reduced.

(4) The electronic device fabrication method according to the present invention comprises a semiconductor device fabrication method which is a fabrication method for an electronic device that comprises a semiconductor device. As a result, the characteristics of the electronic device can be improved. An electronic device is generally called a device that exhibits a fixed function that comprises the semiconductor device of the present invention but is not particularly limited to such a constitution. Electronic devices include all devices that require a semiconductor device such as, for example, a general computer device that comprises the semiconductor device, a cellular phone, a PHS, a portable information device (so-called 'PDA'), an electronic notebook, an IC card, a video camera, a television, a large screen, and so forth.

In addition, the electronic device according to the present invention comprises a semiconductor that is fabricated by using the semiconductor device fabrication method mentioned above. A highly reliably electronic device can accordingly be obtained.

DESCRIPTION OF DRAWINGS

FIG. 7 shows the relationship between the height of the nozzle and the pressure of the effluent gas;

FIG. 8 shows the relationship between the shape and angle of the nozzle and the pressure of the effluent gas;

FIG. 9 shows the relationship between the distance between the nozzle and air guide pipe and the substrate temperature;

FIG. 11 shows the result of measuring the silicon film thickness after recrystallization and the silicon oxide film thickness;

FIG. 22 shows an example of an electronic device that uses an electro-optical device.

DETAILED DESCRIPTION

Further, in this embodiment, thermal processing is performed on a semiconductor layer by using a gas burner that uses a mixed gas of hydrogen and oxygen as its fuel. The thermal processing is sometimes called 'hydrogen flame processing' hereinbelow. Further, the flame of the gas burner is sometimes called the 'hydrogen flame'. Thermal processing includes, for example, thermal processing when a silicon film (semiconductor film, semiconductor layer) is re-crystallized.

An embodiment of the present invention will be described in detail hereinbelow with reference to the drawings. The same or related symbols are assigned to those elements which have the same functions and the description of such elements is not repeated here.

1) Semiconductor Fabrication Device

First, a semiconductor fabrication device that is employed in the fabrication of the semiconductor device of the present embodiment will be described with reference to FIGS. 1 to 9.

Figure 1:
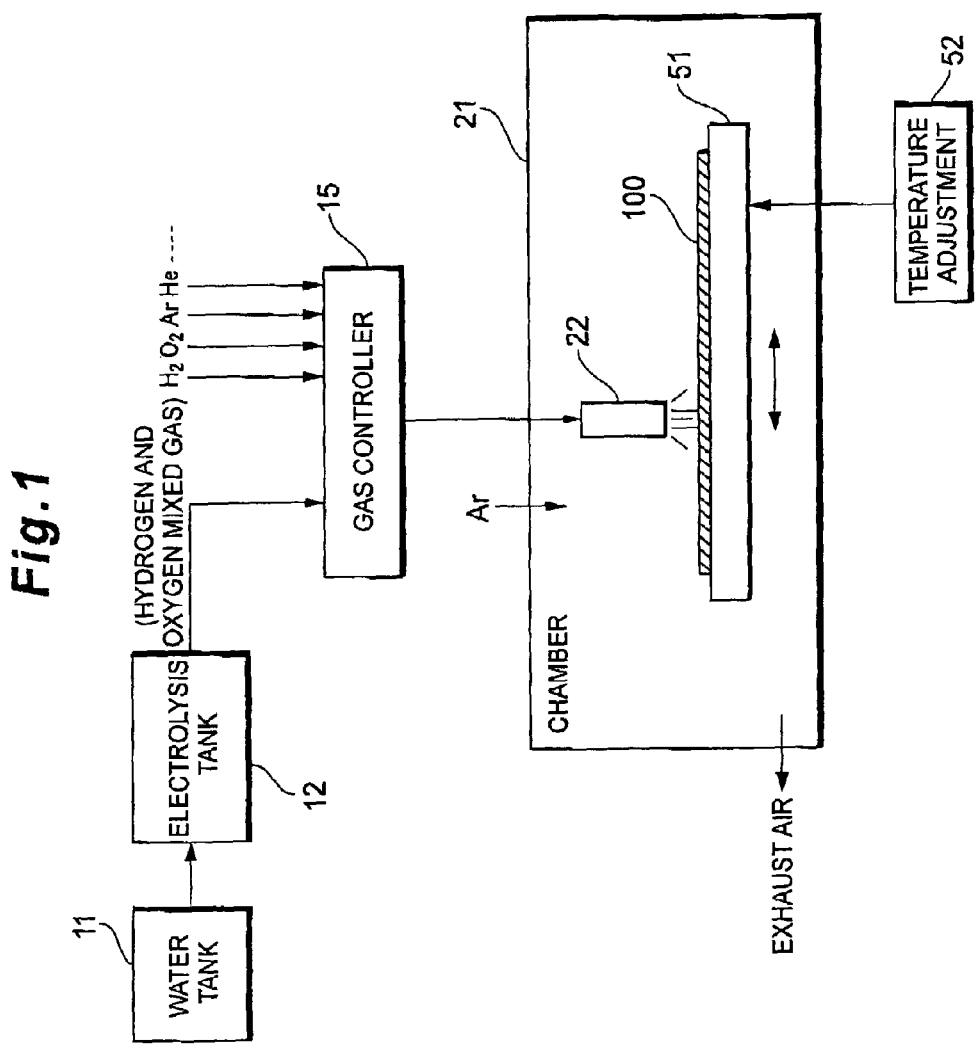
FIG. 1 is a constitutional view of a semiconductor fabrication device that is used in fabricating a semiconductor device of a first embodiment.

FIG. 1 shows a constitutional view of a semiconductor fabrication device that is used in the fabrication of the semiconductor device of this embodiment. In FIG. 1, pure water is stored in a water tank 11 and water is supplied to an electrolysis tank (electrolysis device) 12. The water is subjected to electrolysis by the electrolysis tank 12 and thus separated into hydrogen gas and oxygen gas. The separate hydrogen gas and oxygen gas are supplied to a gas controller 15. The gas controller 15 is constituted by a computer system, a regulator valve, a flow rate regulator valve, and a variety of sensors and so forth and the supply amount of hydrogen gas and oxygen gas (mixed gas) supplied to a downstream gas burner 22, the supply pressure and mixing ratio of the two gases, and so forth, are adjusted in accordance with a preset program.

Furthermore, the gas controller 15 also introduces hydrogen gas ($H_2$) and oxygen ($O_2$) which are supplied from a gas storage tank (not shown) to the mixed gas and supplies the resulting mixed gas to the gas burner 22. As a result, the mixing ratio (mixing proportions) of the hydrogen and oxygen in the mixed gas is the stoichiometric composition ratio of water ($H_2O$) ($H_2:O_2$=2 mol:1 mol) and a hydrogen-rich or oxygen-rich mixed gas is obtained.

The gas controller 15 is also capable of introducing an inert gas such as argon (Ar), helium (He), or nitrogen ($N_2$) that is supplied from a gas storage tank (not shown). As a result, control of the flame temperature (combustion temperature) and flame state of the gas burner 22 is exercised.

The water tank 11, electrolysis tank 12, and gas controller 15 constitute a fuel (source fuel) supply section.

A chamber (processing chamber) 21 that forms a closed space is disposed downstream of the gas controller 15. The gas burner 22 that produces the flame for the thermal processing and a stage section (mounting table) 51 or the like that allows a substrate (semiconductor substrate or glass substrate or the like) 100 which is the processing target to move relative to the gas burner 22 are disposed in the chamber 21.

The constitution is such that the atmosphere in the chamber 21 can be set such that the internal pressure is on the order of atmospheric pressure to 0.5 MPa and the internal temperature is on the order of room temperature to 100° C., for example. An inert gas such as argon can be introduced to the chamber 21 in order to keep the air pressure in the chamber 21 in the desired state.

The stage section 51 is provided with a mechanism that moves the table whereon the substrate is placed at a fixed speed for the sake of particle prevention. Further, in order to prevent heat shock of the substrate 100 caused by a sudden temperature difference or the like, a mechanism that heats (preheats) or cools the mounting table of the substrate 100 is provided and control of the temperature of the mounting table is performed by an external temperature regulation section 52. An electrical heater mechanism is used for the heating and a cooling mechanism that uses coolant gas or cooling water is used for the cooling.

Figure 2:
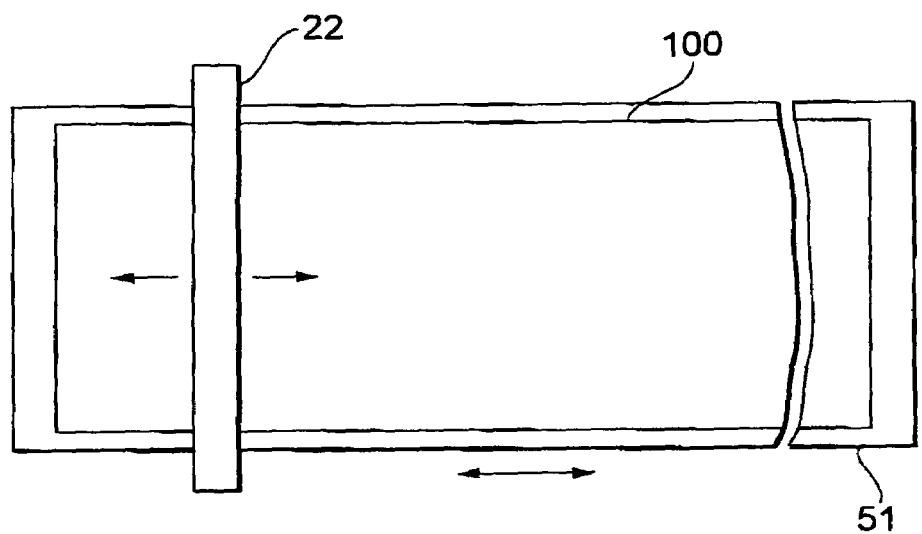
FIG. 2 is a planar view of a constitutional example of a gas burner of a semiconductor fabrication device.

FIG. 2 is a planar view of a constitutional example of a gas burner section of the semiconductor fabrication device. As shown in FIG. 2, the gas burner 22 of the semiconductor fabrication device in FIG. 1 is formed by a longitudinal member that is larger than the width (vertical direction in FIG. 2) of a stage section 51 and a flame that is wider than the width of the stage section 51 can be radiated. The constitution is such that the gas burner 22 scans the substrate 100 as a result of moving the stage section 51 in a direction orthogonal to the longitudinal direction of the gas burner 22 (direction of the arrow in FIG. 2) or by moving the gas burner 22.

Figure 3:
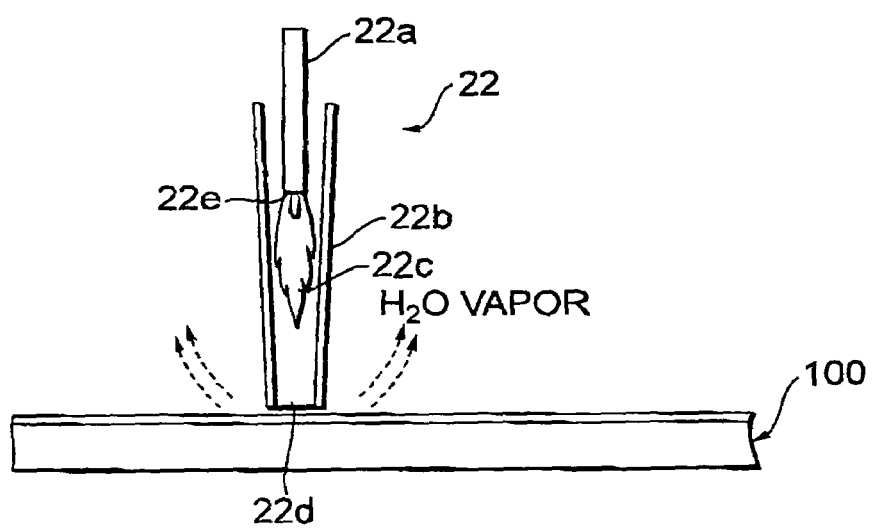
FIG. 3 is a cross-sectional view of a constitutional example of a gas burner section of the semiconductor fabrication device.

FIG. 3 is a cross-sectional view of a constitutional example of a portion of the gas burner of the semiconductor fabrication device. As shown in FIG. 3, the gas burner 22 is constituted by an air guide pipe 22a in which an outlet hole for gas that leads out the mixed gas to the combustion chamber is provided, a shield device 22b that surrounds the air guide pipe 22a, a combustion chamber 22c that is surrounded by the shield device 22b and in which mixed gas is combusted, a nozzle 22d which is an outlet through which combustion gas is output from the shield device 22b to the outside, and an emission port 22e for mixed gas that is provided in the air guide pipe 22a.

When a wide gap (distance) is established between the nozzle 22d and substrate 100, the pressure drops when the combustion gas is discharged from the nozzle. When a narrow gap is established (squeezed) between the nozzle 22d and substrate 100, the pressure drop of the combustion gas is suppressed and the pressure rises. Hence, the gas pressure can be adjusted by regulating the gap.

The steam annealing, hydrogen-rich annealing, and oxygen-rich annealing can be promoted by pressurization. The various annealing processes can be selected by setting the mixed gas (ratio). FIG. 3 shows an aspect in which steam ($H_2O$) vapor is emitted.

As will be described subsequently, by forming a plurality of emission ports 22e for mixed gas or forming the emission port 22e with a line shape, the shape of the flame (torch) of the combustion chamber 22c of the gas burner 22 can be a line (long flame) or a plurality of torch shapes. The temperature profile in the vicinity of the gas burner 22 is preferably made rectangular in the scanning direction of the flame, depending on the design of the nozzle 22d or the like of the emission port 22e and shield device 22b.

Figure 4A:
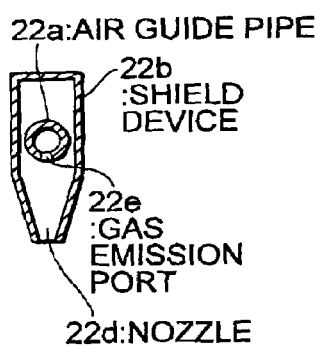
FIG. 4 shows a first constitutional example of the gas burner of the semiconductor fabrication device.
Figure 4B:
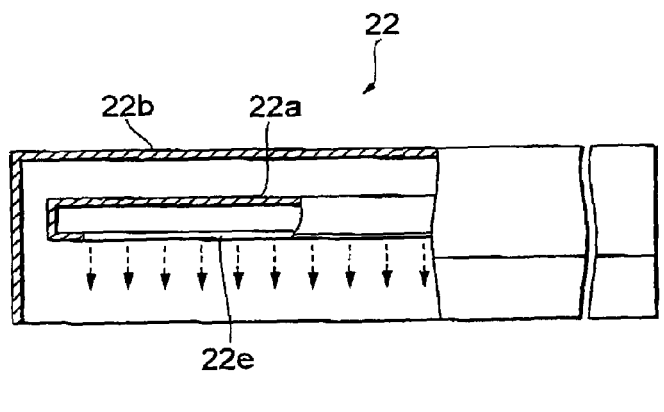
Figure 4C:
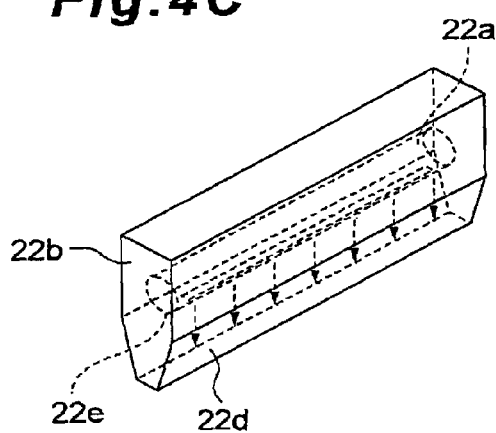

FIG. 4 shows a first constitutional example of the gas burner of the semiconductor fabrication device. FIG. 4A is a cross-sectional view in the width direction of the gas burner 22, FIG. 4B shows a partial cross-sectional view in the longitudinal direction of the gas burner 22, and FIG. 4C is a perspective view that schematically shows a gas burner section. The same symbols were assigned in FIGS. 4A, 4B, and 4C to those parts that correspond with FIG. 3.

In this example, the shield device 22b is formed to surround the air guide pipe 22a. The lower part of the shield device 22b is the nozzle 22d and the gas emission ports 22e are provided with a line shape (long hole) at the bottom of the air guide pipe 22a (the nozzle 22d side). Further, the width of the holes may be changed depending on the location in order to equalize the emission amounts of each part of the linear gas emission ports 22e.

Figure 5A:
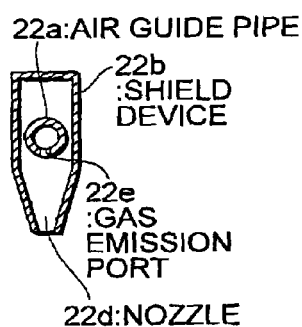
FIG. 5 shows a second constitutional example of the gas burner of the semiconductor fabrication device.
Figure 5B:
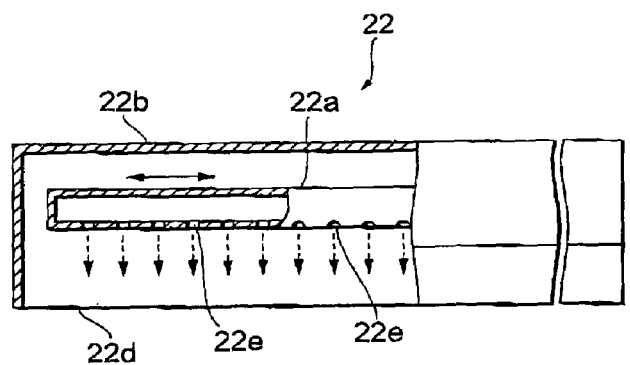

FIG. 5 shows a second constitutional example of the gas burner section of the semiconductor fabrication device, showing another constitutional example of the gas burner 22. FIG. 5A is a cross-sectional view in the width direction of the gas burner 22 and FIG. 5B shows a partial cross-sectional view in the longitudinal direction of the gas burner 22. In FIGS. 5A and 5B, the same symbols have been assigned to the parts corresponding with FIG. 3.

In this example, the shield device 22b is formed to surround the air guide pipe 22a. The lower part of the shield device 22b is the nozzle 22d and a plurality of gas emission ports 22e are provided at equal intervals in the lower part of the air guide pipe 22a (nozzle 22d side). The constitution is such that the air guide pipe 22a can be suitably moved in the illustrated lateral direction, for example, in order to make uniform the gas density of the combustion chamber and render the flow rate of the gas flowing to the outside from the nozzle 22d homogeneous. Further, the air guide pipe 22a is fixed and the interval between the gas emission ports 22e may be changed if necessary depending on the location in order to equalize the emission amounts of the respective parts of the gas emission ports 22e.

Figure 6A:
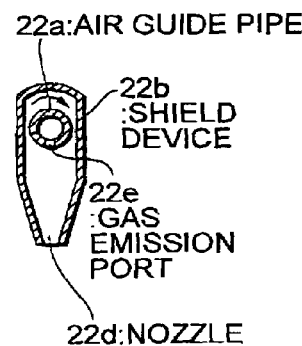
FIG. 6 shows a third constitutional example of the gas burner of the semiconductor fabrication device.
Figure 6B:
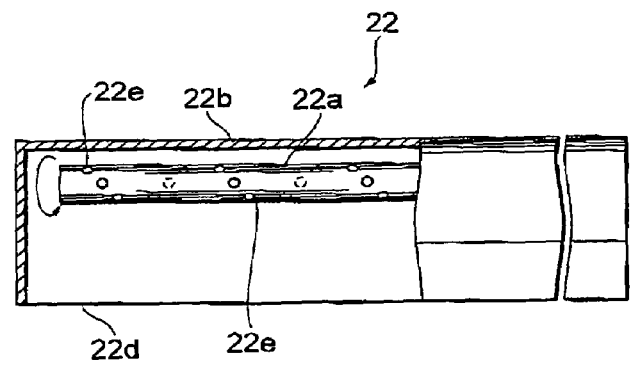

FIG. 6 shows a third constitutional example of the gas scanner section of the semiconductor fabrication device. FIG. 6A is a cross-sectional view in the width direction of the gas burner 22 and FIG. 6B is a partial cross-sectional view in the longitudinal direction of the gas burner 22. In FIGS. 6A and 6B, the same symbols are assigned to the parts corresponding with FIG. 3.

In this example, the shield device 22b is formed to surround the air guide pipe 22a. The lower part of the shield device 22b is the nozzle 22d and a plurality of gas emission ports 22e are provided helically at equal intervals in the side of the air guide pipe 22a. The constitution is such that the air guide pipe 22a can be rotated in the direction of the arrows in FIGS. 6A and 6B in order to make the gas density in the combustion chamber uniform and render the flow rate of the gas flowing from the nozzle 22d to the outside uniform.

FIG. 7 shows the relationship between the height of the nozzle and the pressure of the effluent gas. As shown in FIG. 7A, the pressure of the effluent combustion gas can be lowered by spacing the nozzle 22d apart from the substrate 100. Further, as shown in FIG. 7B, the pressure of the effluent combustion gas can be raised by bringing the nozzle 22d closer to the surface of the substrate 100.

FIG. 8 shows the relationship between the shape and angle of the nozzle and the pressure of the effluent gas. As shown in FIG. 8, the pressure of the effluent gas can be adjusted by regulating the shape and attitude of the nozzle 22d (by regulating the shape of the emission ports and the angle with respect to the substrate, for example). In this example, as shown in FIG. 8A, the shape of the emission port of the nozzle 22d is open on one side. Hence, the pressure of the effluent combustion gas can be lowered in a state where the gas burner 22 is upright. Further, as shown in FIG. 8B, when the gas burner 22 is turned or inclined, the emission port of the nozzle 22d can be brought close to the surface of the substrate 100 to raise the pressure of the effluent combustion gas.

FIG. 9 shows the relationship between the distance between the nozzle and air guide pipe and the pressure of the effluent gas. As shown in FIG. 9, the temperature of the effluent gas emitted from the nozzle 22d can be adjusted by being able to vary the relative positional relationship between the air guide pipe 22a and the shield device 22b. For example, the structure is one in which the air guide pipe 22a can be made to advance or retreat toward/from the nozzle 22d in the shield device 22b. The combustion chamber 22c can be moved and the distance between the heat source and nozzle 22d can be changed. The distance between the heat source and substrate can be adjusted.

Therefore, as shown in FIG. 9A, when the air guide pipe 22a is brought relatively close to the nozzle 22d, the combustion gas that is emitted from the nozzle 22d assumes a relatively high temperature. Further, as shown in FIG. 9B, when the air guide pipe 22a is spaced relatively far apart from the nozzle 22d, the combustion gas emitted from the nozzle 22d assumes a relatively low temperature.

Such a structure allows the temperature of the combustion gas to be adjusted for a satisfactory condition without changing the gap between the gas burner 22 and substrate 100. Naturally, the substrate temperature may be adjusted by changing the gap between the gas burner 22 and the substrate. A constitution where the gas temperature is adjusted by changing the gap between the gas burner 22 and the substrate and by adjusting the relative positional relationship between the air guide pipe 22a and shield device 22b is possible. Further, the substrate temperature can be adjusted by changing the scanning speed of the gas burner 22 with respect to the substrate.

Further, the structures of the gas burners shown in FIGS. 4 to 9 can be suitably combined.

For example, the constitution shown in FIG. 7 and the constitution in FIG. 9 can be combined. The gap between the nozzle 22d and substrate 100 can be adjusted by constituting the whole of the gas burner 22 shown in FIG. 7 close to or spaced apart from the substrate 100, whereby the temperature of the substrate 100 (surface temperature, for example) can be adjusted. Furthermore, the temperature of the substrate 100 can be minutely adjusted by allowing the air guide pipe 22a in the gas burner 22 to advance and retreat toward from the nozzle 22d as shown in FIG. 9. As a result, taking the temperature of the substrate 100 as the targeted thermal processing temperature is straightforward.

In addition, the constitutions shown in FIGS. 7 and 8 can be combined. The gap between the nozzle 22d and substrate 100 can be adjusted by constituting the whole of the gas burner 22 close to or spaced apart from the substrate 100 (See FIG. 7), whereby the surface temperature of the substrate 100 and the pressure of the flame is adjusted. In addition, the surface temperature of the substrate 100 and pressure of the flame is adjusted by adjusting the attitude of the gas burner 22 with respect to the whole substrate 100 (See FIG. 8).

Furthermore, the constitutions shown in FIGS. 7, 8 and 9 can be combined. The gap between the nozzle 22d and substrate 100 can be adjusted by constituting the whole gas burner 22 close to or spaced apart from the substrate 100, whereby the surface temperature of the substrate 100 and the pressure of the flame is roughly adjusted (See FIG. 7). In addition, the pressure of the flame of the surface of the substrate 100 is adjusted by adjusting the attitude of the gas burner 22 with respect to the whole substrate 100 (FIG. 8). In addition, the surface temperature of the substrate 100 can be minutely adjusted by allowing the air guide pipe 22a in the gas burner 22 to advance and retreat toward from the nozzle 22d (See FIG. 9). According to this constitution, more accurate thermal processing is possible.

Furthermore, although not illustrated, the shield 22b of the gas burner 22 can be a movable-type shield and the opening (emission port and aperture) of the nozzle 22d can be widely changed in the scanning direction of the gas burner 22. As a result, the exposure time of the processed part of the substrate 100 in the scanning direction of the gas burner 22, the temperature profile of the thermal processing of the substrate 100, the thermal processing temperature, the flame pressure and so forth can be adjusted.

Because the semiconductor fabrication device described above is provided with a long gas burner that traverses the substrate, thermal processing of a large-area substrate such as a glass pane can be performed. Because hydrogen and oxygen which serve as fuel can be obtained by electrolysis of water, gas material is easy to obtain and running costs are low.

In addition, in the case of the semiconductor fabrication device, although the gas burner 22 is provided with the shield device 22b, processing may be performed in a state where the gas burner 22 is exposed to the open air, that is, by radiating the flame directly from the air guide pipe 22a, without using the shield device 22b. In addition, although a case where combustion gas is emitted from the shield device 22b has been described for the semiconductor fabrication device, adjustments may be made so that a flame is emitted from the shield device 22b.

Further, the processing of the substrate may be processing using combustion gas or processing that causes direct contact by the flame. Control of this processing can be suitably established for each of the conditions of the processing.

The flame has a strongly reducing inner flame (reducing flame) of intense reduction in particular and a strongly oxidizing outer flame (oxidizing flame) and settings that correspond with the processing conditions can be taken by causing either the inner flame or outer flame to contact the substrate. Further, the inner flame has a relatively low temperature (about 500° C.) and the outer flame has a high temperature (about 1400 to 1500° C.). The temperature between the inner and outer flames is even higher at about 1800° C. Therefore, settings that correspond with the processing conditions can be taken.

Furthermore, in the thermal processing steps, a reduction atmosphere (hydrogen-rich atmosphere) or oxygen atmosphere (oxygen-rich atmosphere) can be easily established by suitably setting the mixing ratios and supply amounts of oxygen and hydrogen.

In addition, because the hydrogen and oxygen constituting the fuel is obtained by the electrolysis of water, a mixed gas of hydrogen and oxygen of 2 mol; 1 mol which is the stoichiometric composition ratio of water ($H_2O$) can be easily obtained. By adding additional oxygen or hydrogen to the mixed gas, an oxygen atmosphere (oxygen-rich atmosphere) or reduction atmosphere (hydrogen-rich atmosphere) respectively can be easily established.

Adjustment of the flame temperature is also straightforward. The flame state (temperature, gas pressure, and so forth) can be adjusted by also introducing an inert gas or adjusting the flow rate of the source gas.

In addition, the desired temperature profile can be easily obtained by adjusting the nozzle shape and so forth of the gas burner.

Such processing that uses a gas burner is highly productive processing can be executed at low cost. The source gas of the flame is hydrogen and oxygen and so forth and is a clean excimer whose principal product is water. Therefore, the burden on the environment (environmental damage) can be reduced.

2) Semiconductor Device Fabrication Method

Fabrication Method 1

Fabrication method 1 of a semiconductor device (TFT: thin film transistor) that employs the abovementioned semiconductor fabrication device will be described next with reference to FIGS. 10 to 15. FIG. 10 is a step cross-sectional view that shows the fabrication method of the semiconductor device (TFT) of Fabrication method 1 (FIG. 15 is the same method).

Figure 10A:
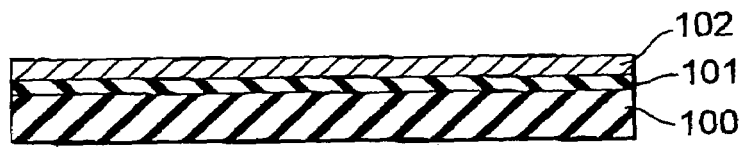
FIG. 10 is a cross-sectional view of the steps that represent a semiconductor device (TFT) fabrication method of a fabrication method 1.

First, as shown in FIG. 10A, a glass substrate (substrate, transparent substrate, insulation substrate) 100 is provided. Glass substrates are used in liquid crystal display devices and so forth and, depending on the device, large-area substrates are used. An oxide silicon film, for example, is formed as a base protection film (base oxide film or base insulation film) 101 on substrate 100. The oxide silicon film is formed by taking TEOS (tetraethylorthosilicate, tetraethoxysilane) and oxygen gas and so forth as the source gas and by using plasma CVD (chemical vapor deposition, for example).

Thereafter, an amorphous silicon film 102, for example, is formed as the semiconductor film on a base protection film 101. This silicon film is formed by CVD using $SiH_4$ (monosilane) gas, for example.

Figure 10B:
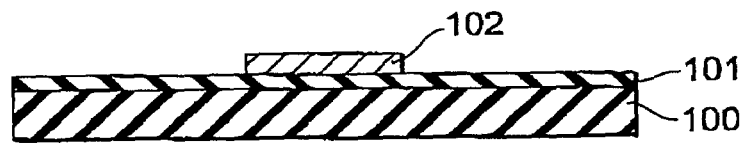

Thereafter, as shown in FIG. 10B, a photoresist film (not shown) (also called simply the 'resist film' hereinbelow) is formed on the silicon film 102 and the resist film (mask film, resist mask) is made to remain in the form of an island through exposure and development (photolithography). Thereafter, using the resist film as a mask, the silicon film 102 is etched to form a semiconductor element region (island region). The resist film is then removed. The photolithography, etching and resist-film removal processes are known as 'patterning' hereinbelow.

Figure 10C:
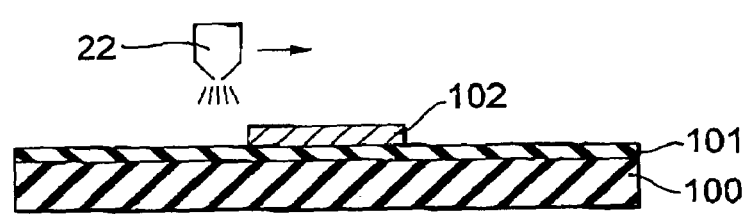
Figure 10D:
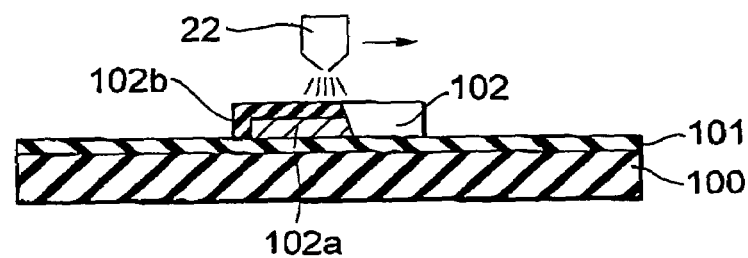
Figure 10E:
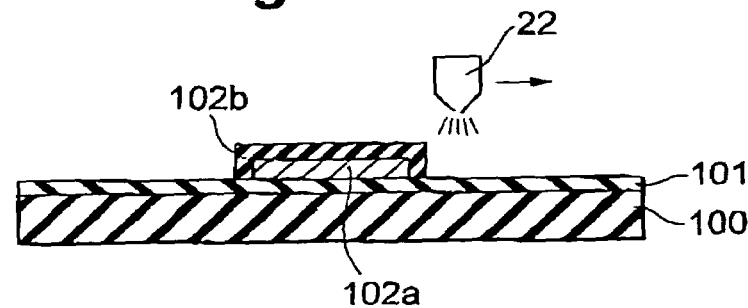

Hydrogen flame processing is then performed on the silicon film 102 to re-crystallize the silicon and produce a polycrystalline silicon film 102a (FIGS. 10C to 10E). Thereupon, a silicon oxide film 102b is formed on the polycrystalline silicon film 102a.

That is, the substrate 100 is placed on the stage section 51 (See FIG. 1 and so forth) and thermal processing is performed by scanning the gas burner 22 on the substrate 100 (silicon film 102) to recrystallize the silicon film 102. Thereupon, as shown in FIGS. 10C to 10E, the silicon film 102 is changed into polycrystalline silicon (film) 102a as the scanning with the hydrogen flame is performed, and the silicon oxide film 102b is formed on the surface of the polycrystalline silicon (film) 102a.

For example, by making the substrate temperature from 600 to 1500° C., the width in the scanning direction of the flame (high temperature gas) that flows from the nozzle 22d 10 mm, and the gas pressure of the flame 0.1 to 0.2 MPa, a silicon film 103 is exposed for about 1 millisecond to 100 milliseconds per spot area of the flame. In the case of thermal processing with which the substrate temperature is about 600 to 750° C. as a result of heating for a short time, liquid crystal display glass (soda glass, for example) with a low heat resistance or the like can be used for the substrate. Naturally, the speed of the scanning with the hydrogen flame and the distance between the substrate and the tip of the burner (gap) and so forth are adjusted, and thermal processing in which the substrate temperature is equal to or more than 750 to 900° C. can be performed. In this case, a substrate with a high heat resistance (quartz substrate, for example) may be used. Further, during this thermal processing, the reaction ratios of hydrogen ($H_2$) and oxygen ($O_2$) can be set at 2:1 by means of a program that is preset by the gas controller 15. The oxygen ratio may also be changed and another gas (inert gas) may be added.

The results of experiments by the present inventor will be described next. The silicon film thickness and the silicon oxide film thickness after recrystallization were measured for five samples A to E that had been subjected to hydrogen flame processing under a variety of conditions. The results are shown in FIG. 11.

Figure 12A:
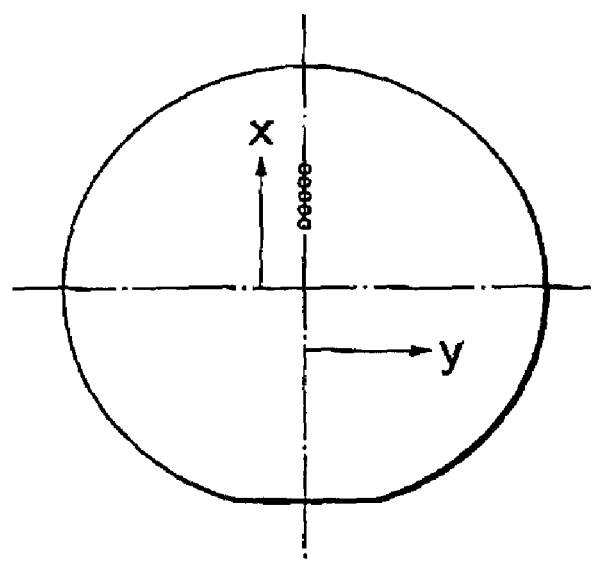
FIG. 12 shows hydrogen flame processing and measurement positions.
Figure 12B:
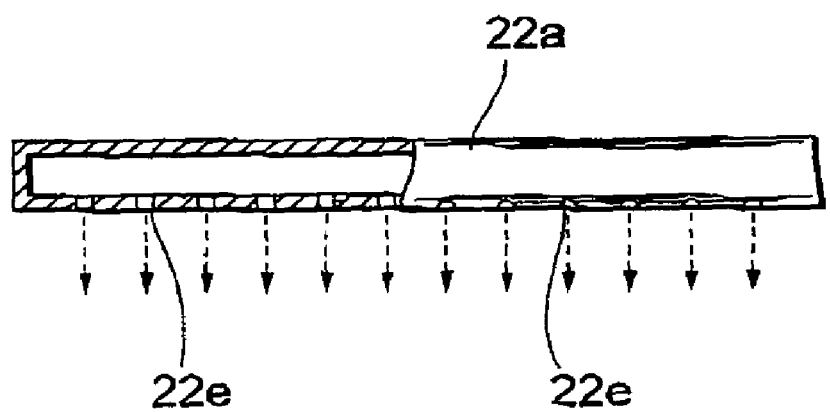

After hydrogen flame processing under the conditions shown below was performed for a variety of samples, the measurement positions at 0.3 mm intervals over 30 mm were established in direction x shown in FIG. 12A and the silicon oxide film thickness at these points was measured. Further, the hydrogen flame processing (thermal processing, re-crystallization processing) was performed by scanning, in direction y in FIG. 12A, a flame (spot flame) radiated from the air guide pipe 22a in which a plurality of hole-shaped gas emission ports 22e are provided shown in FIG. 12B. FIG. 12 shows the hydrogen flame processing and measurement positions.

Sample A represents a case where the Gap was 50 mm and the scanning speed was 62 mm/s; sample B represents a case where the Gap was 50 mm and the scanning speed was 50 mm/s; sample C represents a case where the Gap was 30 mm and the scanning speed was 98 mm/s; sample D represents a case where the Gap was 30 mm and the scanning speed was 65 mm/s; and sample E represents a case where the Gap was 30 mm and the scanning speed was 38 mm/s.

As shown in FIG. 11, the film thickness of the silicon film after re-crystallization was on the order of about 0.051 µm for samples A to D and the film thickness of the silicon oxide film on the surface of the silicon film was on the order of about 0.004 µm. In the case of sample E, the silicon film after crystallization was 0.04 µM and the silicon oxide film was on the order of 0.009 µm. In the case of sample E, the extent of the oxidation of the surface of the silicon film was greater than that of the other samples. Accordingly, it was judged that the film thickness of the silicon oxide film increased as a result of a small Gap and slow scanning. Further, inconsistencies between the various data as a result of nonuniformity of the flame temperature were prominent as the scanning speed dropped. Hence, samples A to E were compared by means of the highest values of the various data in FIG. 11.

Thus, it was confirmed from the results of the experiments by the present inventor that a silicon oxide film was formed on the surface of the silicon film after crystallization.

Accordingly, the oxide film can be used as a gate insulation film. Thus, according to this fabrication method, the re-crystallization of the silicon film 102 and the formation of the silicon oxide film 102b can be performed by one simple and rapid process such as thermal processing using the flame of the gas burner 22. Further, if the width of the gas burner 22 is greater than that of the semiconductor substrate 100 (See FIG. 2) the whole of the substrate 100 can be thermally processed in one scan. In addition, because the silicon film 102 is very thin with respect to the size of the flame of the gas burner 22, the silicon oxide film 102b is formed on the sides of the silicon film 102. Accordingly, after patterning the silicon film 102, the polycrystalline silicon film 102a can be covered by the silicon oxide film 102b by performing hydrogen flame processing (See FIG. 10E).

Furthermore, according to the hydrogen flame processing, an oxygen radical (O*), a hydrogen radical (H*), and a hydroxyl radical (OH*) or the like exist in the flame or around the flame in addition to the source gas ($O_2$, $H_2$) and $H_2O$ (steam) which is a product of the fuel. Further, hydrogen and oxygen are produced by the ionization of steam produced in the fuel gas. Alternatively, hydrogen and oxygen gas that have not completely combusted are also present. Hence, the results of so-called hydrogen annealing and steam annealing are also reported.

Figure 13:
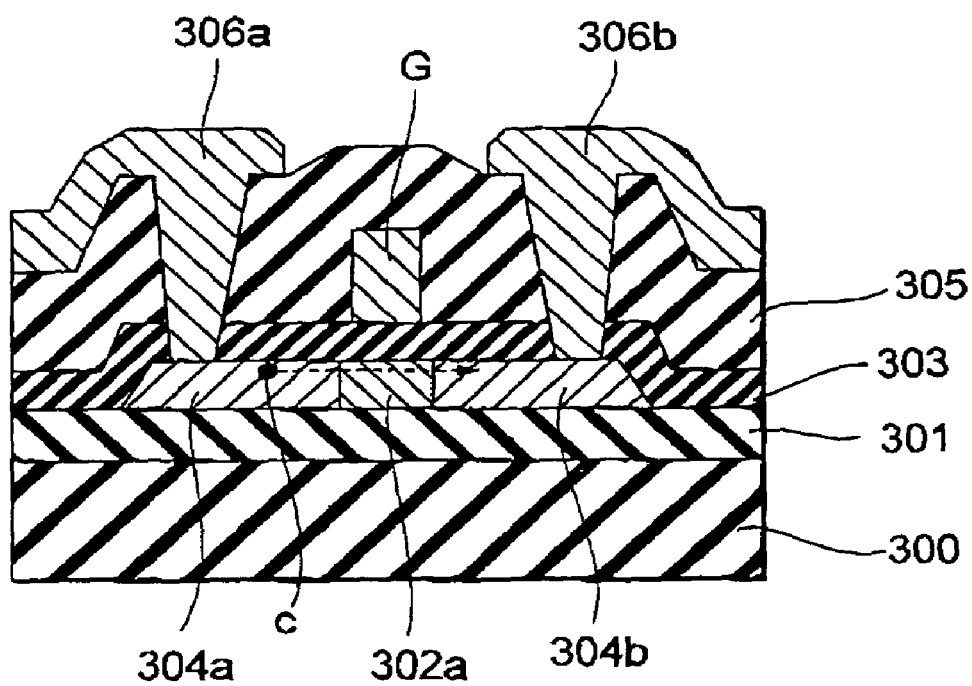
FIG. 13 is a cross-sectional view to illustrate the advantage of fabrication method 1.

(1) That is, dangling bonds of the silicon are produced at the grain boundaries and inside the crystal grains when the silicon is recrystallized. As a result of these dangling bonds, the carrier mobility decreases. However, according to the above process (fabrication method 1), the dangling bonds and hydrogen are also linked by performing hydrogen flame processing. Hence, as shown in FIG. 13, the mobility of the carriers c can be improved. FIG. 13 is a cross-sectional view that serves to illustrate the results of fabrication method 1. Further, 300 is the substrate, 301 is the base protective film, 302a is a polycrystalline silicon film, 304a and 304b are the source and drain regions, 303 is the gate insulation film, G is the gate electrode, 305 is the interlayer insulation film, 306a and 306b are the source and drain electrodes (the same is true of FIG. 14A).

Furthermore, by performing hydrogen-rich hydrogen flame processing, linkage of the dangling bonds and hydrogen can be promoted. 'Hydrogen-rich' means that the ratios of hydrogen gas ($H_2$) which is the supply gas and oxygen gas ($O_2$) are obtained by increasing the composition ratio of hydrogen above 2 mol: 1 mol which is the stoichiometric composition ratio of water ($H_2O$).

Figure 14A:
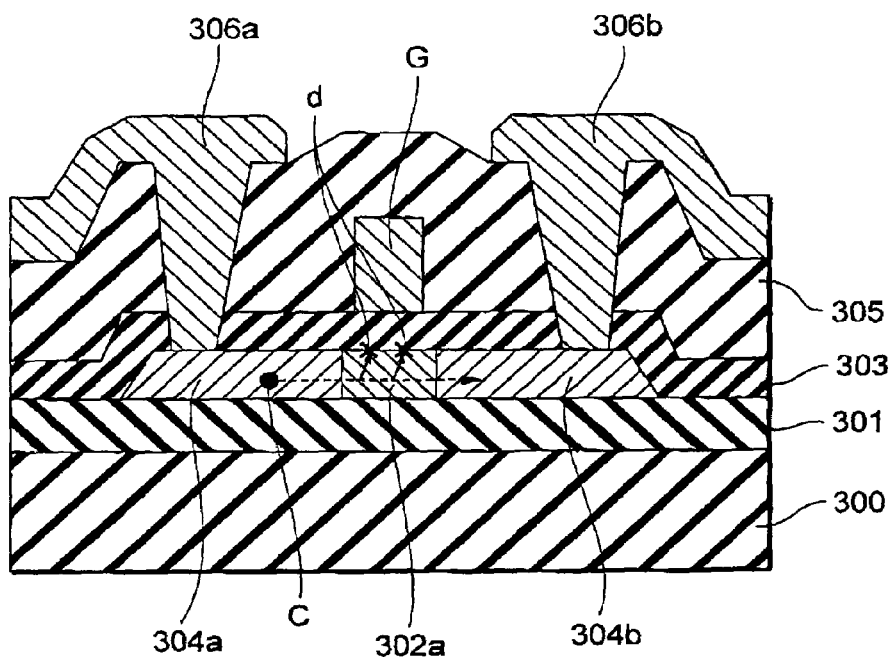
FIG. 14 is a cross-sectional view to illustrate the advantage of fabrication method 1.
Figure 14B:
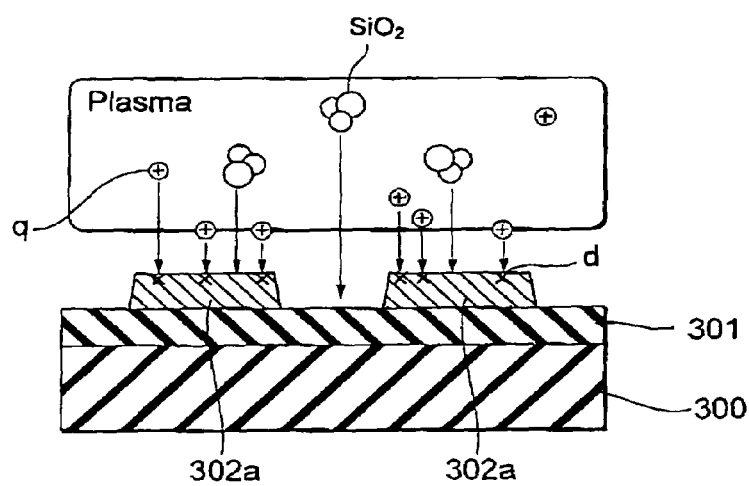

(2) In addition, defects are readily produced at the boundary between the polycrystalline silicon film 102a and the silicon oxide film 102b. As a result of these defects, the interface state is produced and the TFT characteristic drops. More specifically, an obstruction to a steep rise in the channel current, a drop in the TFT switching speed, and an increase in the threshold value potential are afforded. However, according to the above process (fabrication method 1), the dangling bonds and hydrogen and oxygen can be coupled by performing hydrogen flame processing. Hence, the trapping of carriers c in the defects d of the type shown in FIG. 14A can be reduced and the securing of a steep rise in channel current, improvements in the TFT switching speed, and a drop in the voltage of the threshold value potential can be achieved. Further, as shown in FIG. 14B, as a result of the deposition of silicon oxide ($SiO_2$) by plasma CVD, defects d readily occur at the interface between the polycrystalline silicon film 302a and the deposited oxide film as a result of plasma damage at the start of deposition. That is, charged particles q generated by plasma collide with the surface of the polycrystalline silicon film 302a and produce defects d. The silicon grains ($SiO_2$) are sequentially deposited on the defects d. However, according to this process, by performing hydrogen flame processing, plasma damage during deposition of the silicon oxide film 102b can be avoided. Further, defects can be reduced. FIG. 14 is a cross-sectional view that serves to illustrate the results of the fabrication method 1.

In addition, (3) by performing oxygen-rich hydrogen flame processing, (a) the growth of an oxide film can be promoted. (b) Further, oxygen defects in the oxide film can be repaired. In addition, (c) defects at the interface between the polycrystalline silicon film 102a and the silicon oxide film 102b can be repaired with oxygen. The defects of such parts can also be repaired using H atoms but repair using O atoms is thought to an improved characteristic. Oxygen-rich means that the ratio of hydrogen ($H_2$) which is the supply gas and oxygen gas ($O_2$) is obtained by increasing the composition ratio of the oxygen above 2 mol:1 mol which is the stoichiometric composition ratio of water ($H_2O$).

As described in detail hereinabove, according to hydrogen flame processing, the characteristics of the polycrystalline silicon film 102a and silicon oxide film 102b can be improved. Further, the interface state density can be reduced and the TFT characteristics can be improved. Moreover, the abovementioned results are afforded by changing the ratio of hydrogen gas ($H_2$) or oxygen gas ($O_2$) in the supply gas to establish a hydrogen-rich or oxygen-rich mixed gas. Naturally, the defect repair results are also afforded by the hydrogen and oxygen in a case where the ratio of hydrogen gas ($H_2$) and oxygen gas ($O_2$) is 2 mol:1 mol which is the stoichiometric composition ratio of water ($H_2O$).

Although there are a variety of methods for switching the flow rates of the shared gases, hydrogen-rich processing may be executed after oxygen-rich processing, for example. In this case, formation of an oxygen film when re-crystallizing the silicon film is promoted, whereupon defects in the polycrystalline silicon film can be reduced. Naturally, repair of the oxygen defects in the oxide film can be repaired and a reduction in the interface state density of hydrogen or oxygen is possible.

Figure 15A:
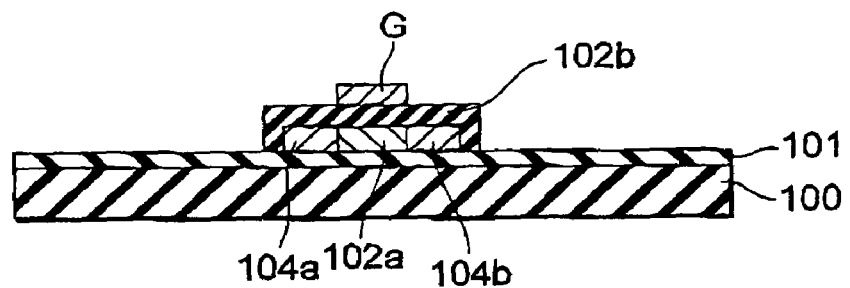
FIG. 15 is a cross-sectional view of the steps that represent a semiconductor device (TFT) fabrication method of a fabrication method 1.

Subsequently, the TFT fabrication steps will be described. After re-crystallization of the silicon film 102, as shown in FIG. 15A, metal material such as Al (aluminum), for example, is formed by sputtering, for example, as an electrically conductive film 104 on the silicon oxide film (gate insulation film) 102b. Thereafter, the electrically conductive film 104 is patterned with a desired shape and a gate electrode (gate electrode wiring) G is formed. In addition to Al, a refractory metal such as TA (tantalum) may be used as the electrically conductive film 104. Further, the electrically conductive film 104 may be formed by using the Sol-Gel method or MOD (Metal-organic decomposition), organic metal deposition method). That is, by applying a metal compound solution and firing same, the electrically conductive film 104 may be formed. Thereupon, the solution can be applied and fired in accordance with the pattern of the gate electrode by means of the drop discharge method. In this case, the patterning step is omitted.

Thereafter, source and drain regions 104a and 104b are formed by impurity ions are implanted in the silicon film 102 (doped, injected) with the gate electrode G serving as a mask. Further, either one of 104a and 104b is the source region while the other is the drain region. Further, the impurity ions that are implanted are $PH_3$ (hydrogen phosphide, phosphine), for example, when an n-type semiconductor layer is formed and $B_2H_6$ (diborane), for example, when a p-type semiconductor layer is formed. Thereafter, thermal processing is performed and the impurity ions are activated.

Here, thermal processing using the abovementioned gas burner 22 may be performed to activate the impurities. In this thermal processing, the flame of the gas burner 22 is preferably oxidizing. The oxidizing flame is obtained by making the mixed gas an oxygen-rich gas. Oxygen in the atmosphere is coupled with the dangling bonds of the silicon atoms at the interface between the polycrystalline silicon film 102a and silicon oxide film (gate insulation film) 102b or the like to electrically deactivate the silicon atoms and reduce the interface state density. Hence, in this thermal processing, the process parameters of the semiconductor fabrication device above are set such that the flame of the gas burner 22 is at a low temperature of 300 to 600° C. and the blowout pressure of the flame is at a high pressure of 1.0 to 2.0 MPa, for example.

Figure 15B:
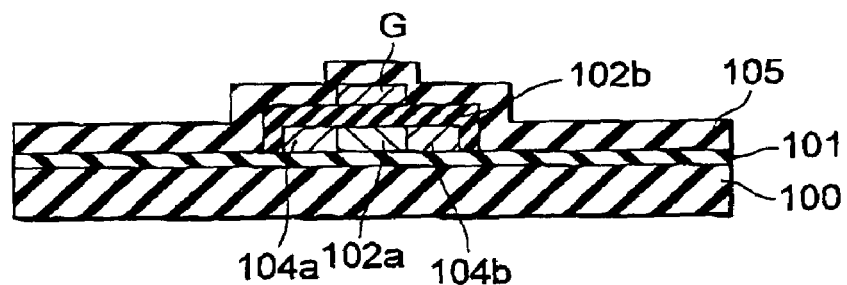

Thereafter, as shown in FIG. 15B, an interlayer insulation film 105 is formed on the gate electrode G. The interlayer insulation film 105 can be formed by plasma CVD with TEOS and oxygen gas, for example, serving as the source gas. Further, an insulating liquid material such as polysilazane solution may be applied and formed by performing thermal processing (firing). When polysilazane solution is used, a silicon oxide film is formed by firing. The polysilazane solution serves to dissolve the polysilazane in an organic solvent (xylene solution, for example).

Figure 15C:
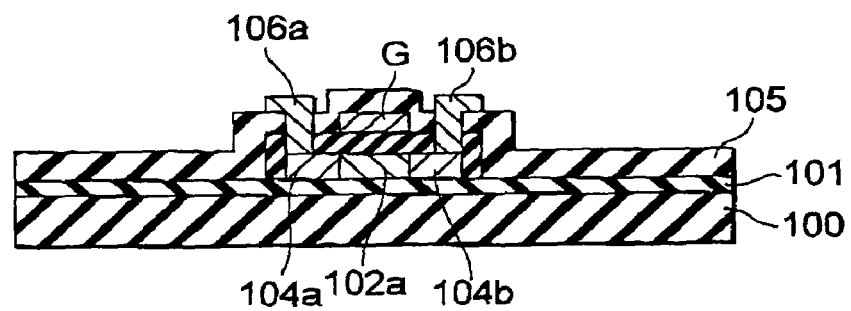

Thereafter, as shown in FIG. 15C, contact holes are formed in the source and drain regions 104a and 104b by patterning the interlayer insulation film 105.

Subsequently, an ITO (indium tin oxide) film, for example, is formed by using sputtering as an electrically conductive film 106 on the interlayer insulation film 105 that includes the inside of the contact holes. A metal material such as Al, Mo (molybdenum) or Cu (copper), for example, may be used in addition to ITO for the electrically conductive film 106. Further, the electrically conductive film 106 may be formed by using the Sol-Gel method or MOD method.

Thereafter, the electrically conductive film 106 is patterned with the desired shape and source and drain electrodes (source and drain extraction electrodes, extraction wiring) 106a and 106b are formed. Further, either of 106a and 106b is the source electrode while the other is the drain electrode.

As a result of the above steps, the TFT is substantially complete. TFTs are used as pixel-electrode drive elements for a liquid crystal display device, electrophoresis unit, or organic EL device, or the like, for example, and are used for logic circuits in the periphery of the pixel region. TFTs are used as elements that constitute the memory and as logic circuits or the like for driving the memory.

Further, although hydrogen flame processing is performed after patterning the silicon film 102 in this fabrication method, patterning may also be performed after performing hydrogen flame processing of the silicon film 102. However, when hydrogen flame processing is performed after patterning the silicon film 102, this is preferable because the thermally oxidized film (gate insulation film 102b) produced by the hydrogen flame processing is then also formed on the walls of the silicon film 102 (See FIG. 10E).

Thus, according to fabrication method 1, an oxide film can be formed on the semiconductor layer surface at the same time as re-crystallizing the semiconductor layer through thermal processing using a gas burner which uses a mixed gas of oxygen and hydrogen as the fuel. The steps can thus be simplified. In addition, as mentioned earlier, the re-crystallized film, oxide film and the characteristics of the interface therebetween can be improved as mentioned earlier.

Furthermore, although defects are readily produced in the film as a result of collisions between the charged particles (See FIG. 14B) and the interface state between the semiconductor layer and oxide film readily rises in the case of CVD, with this fabrication method, the defects and interface states and so forth can be reduced. Further, in comparison with film reformation using a high-pressure steam annealing method required by a costly device, low-cost processing can be executed by means of simple steps.

Fabrication Method 2

In the case of fabrication method 1, although the silicon oxide film 102b formed during re-crystallization is used as the gate insulation film, a silicon oxide film may also be deposited by means of CVD or the like on the silicon oxide film 102b, and a gate insulation film may be constituted by stacked films, namely, a thermally oxidized film and deposition film.

FIGS. 16 and 17 are cross-sectional views of the steps of the fabrication method of the semiconductor device (TFT) of fabrication method 2.

Figure 16A:
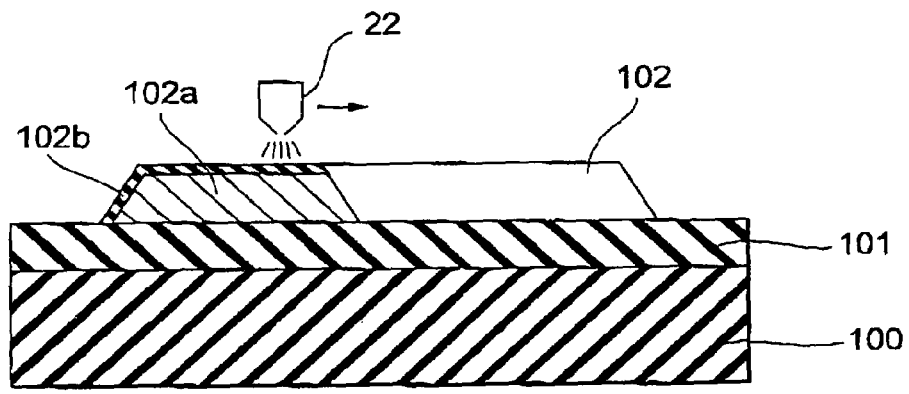
FIG. 16 is a cross-sectional view of the steps that represent a semiconductor device (TFT) fabrication method of a fabrication method 2.

As shown in FIG. 16A, as per fabrication method 1, a base protection film 101 is formed on a glass substrate 100 and the silicon film 102, for example, is formed as a semiconductor film on the base protection film 101, whereupon the silicon film 102 is patterned.

Figure 16B:
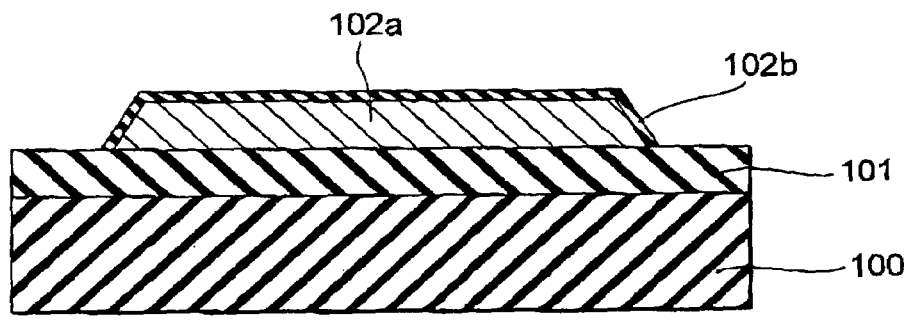

Thereafter, hydrogen flame processing is performed on the silicon film 102 and the silicon is re-crystallized, whereby the polycrystalline silicon film 102a is produced. Thereupon, the silicon oxide film 102b is formed on the polycrystalline silicon film 102a (FIG. 16B).

Figure 16C:
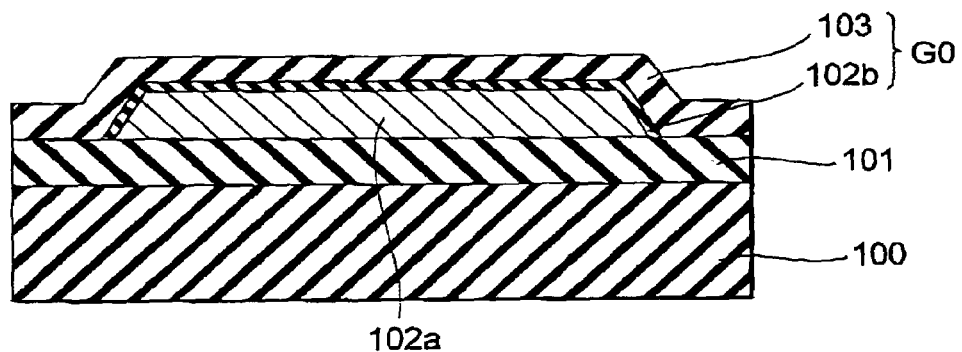

Subsequently, as shown in FIG. 16C, a silicon oxide film 103, for example, is formed as an insulation film on the silicon oxide film 102b. The silicon oxide film 103 is formed by using plasma CVD with TEOS and oxygen gas and so forth, for example, serving as the source gas. The gate insulation film GO is constituted by stacked films of the silicon oxide film 102b which is a thermally oxidized film and the silicon oxide film 103 which is a deposition film.

Thus, according to the above steps, because the gate insulation film GO is constituted by stacked films which are a thermally oxidized film that is formed by hydrogen flame processing and a deposition film (additional insulation film), the film thickness of the gate insulation film can be easily adjusted. As described in fabrication method 1, according to the investigations by the present inventors, the thermally oxidized film formed by the hydrogen flame processing was a few nm. The thermally oxidized film can be made a thick film by controlling the scanning speed and gap and so forth. However, because there are limits on the rendering of a thick film, a deposition film is preferably added when the desired film thickness of the gate insulation film is not satisfied.

So too in this case, as described in detail in fabrication method 1, the defects at the interface between the polycrystalline silicon film 102a and the silicon oxide film 102b are reduced and the interface state density is reduced, whereby the TFT characteristics can be improved.

Figure 17A:
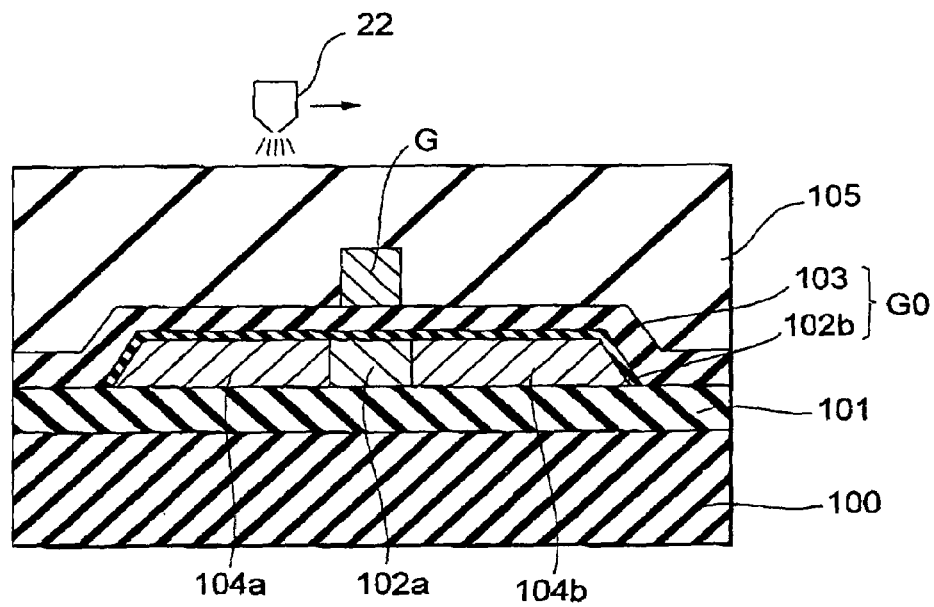
FIG. 17 is a cross-sectional view of the steps that represent a semiconductor device (TFT) fabrication method of a fabrication method 2.

Thereafter, as shown in FIG. 17A, as per fabrication method 1, a gate electrode G is formed on the gate insulation film GO. Subsequently, by implanting impurity ions in the silicon film 102 with the gate electrode G serving as a mask, the source and drain regions 104a and 104b are formed. An interlayer insulation film 105 is then formed on the gate electrode G.

Here, hydrogen flame processing may be performed via the interlayer insulation film 105. That is, the hydrogen flame is scanned over the interlayer insulation film 105. As was described earlier, in addition to the source gases ($O_2$, $H_2$) and $H_2O$ (steam) which is a product of combustion, there exist oxygen radicals (O*), hydrogen radicals (H*), and hydroxyl radicals (OH*) in the flame and in the periphery of the flame. These reactive activated species, atoms, and molecules can approach via the interlayer insulation film 105 or the like. Hence, damage (defects) to the gate insulation GO that is produced when performing etching during formation of the gate electrode G and impurity ion implantation can be repaired.

In particular, because the hydrogen atoms, hydroxyl radicals, and hydrogen molecules and so forth have a small molecular (atomic) size, the diffusion coefficient is large. Therefore, the hydrogen atoms, hydroxyl radicals, and hydrogen molecules are readily diffused close to the gate insulation film GO and contribute to defect repair. Hence, hydrogen-rich hydrogen flame processing may be performed.

Furthermore, the hydrogen flame processing serving such defect repair can be suitably performed after the etching step and impurity ion implantation step in which damage readily occurs. Thus, as described in fabrication method 1, the hydrogen flame processing may be performed after impurity ion implantation. Thus, the hydrogen flame processing that serves such the defect repair may be performed a plurality of times. For example, the hydrogen flame processing may be performed with various timing such as after the insulation film is formed on the source and drain electrodes 106a and 106b or after forming the insulation film that covers the wiring of the upper layer. Thus, the oxidation of the gate electrode and heat load thereof which are caused by the wiring of the lower layer can be reduced by performing hydrogen flame processing via an insulation film after the step of forming the insulation film.

Figure 17B:
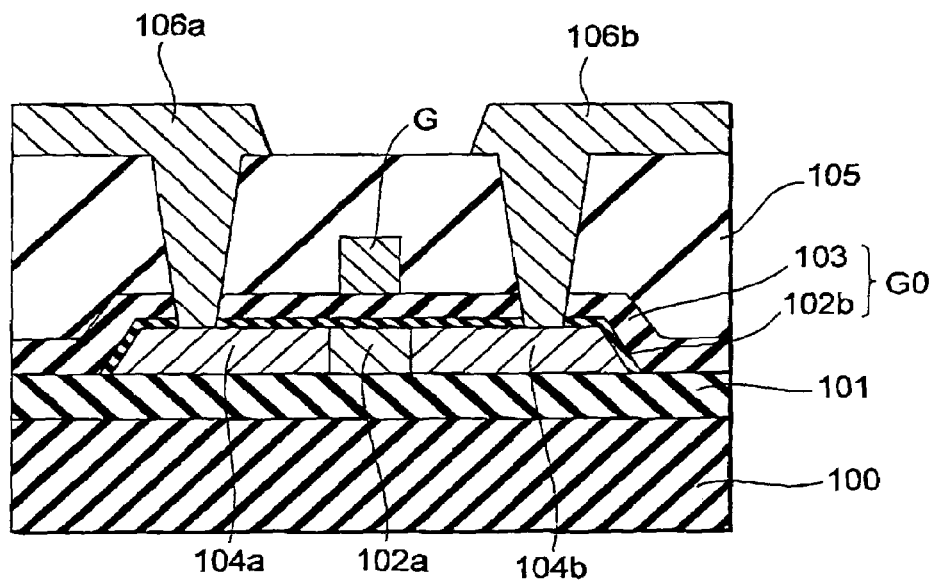

Thereafter, as shown in FIG. 17B, contact holes are formed in the source and drain regions 104a and 104b by patterning the interlayer insulation film 105. The source and drain electrodes 106a and 106b are then formed as per fabrication method 1. Thereafter, the steps of forming the interlayer insulation film and wiring may be repeated to form multilayered wiring. The TFT is substantially completed by the above steps.

Thus, as a result of these steps, the result that the film thickness of the gate insulation film GO is easy to adjust is afforded in addition to the results of the fabrication method 1.

Fabrication Method 3

Although hydrogen flame processing is performed after patterning the silicon film 102 in fabrication method 2, patterning may also be performed after performing hydrogen flame processing on the silicon film 102.

Figure 18A:
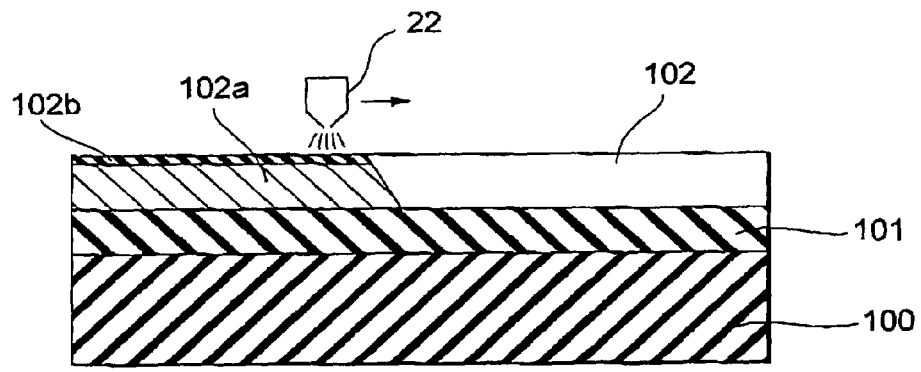
FIG. 18 is a cross-sectional view of the steps that represent a semiconductor device (TFT) fabrication method of a fabrication method 3.
Figure 18B:
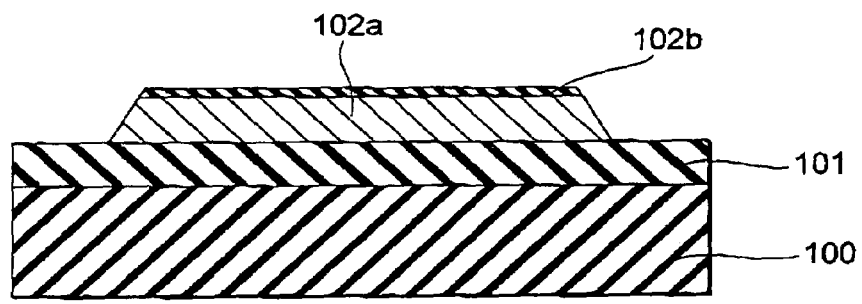
Figure 18C:
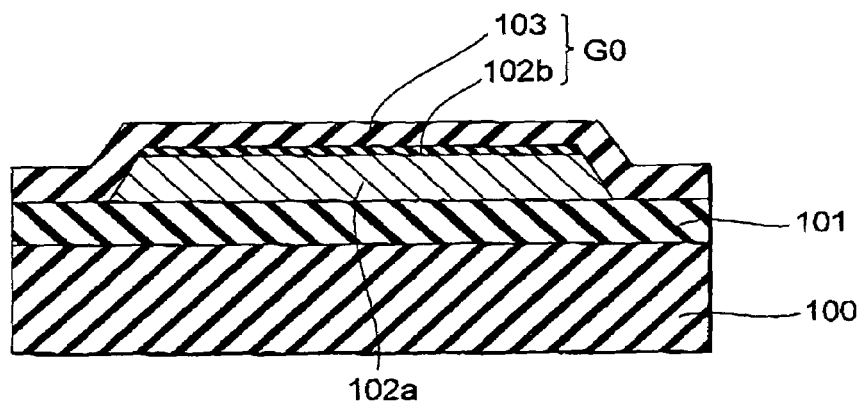
Figure 19:
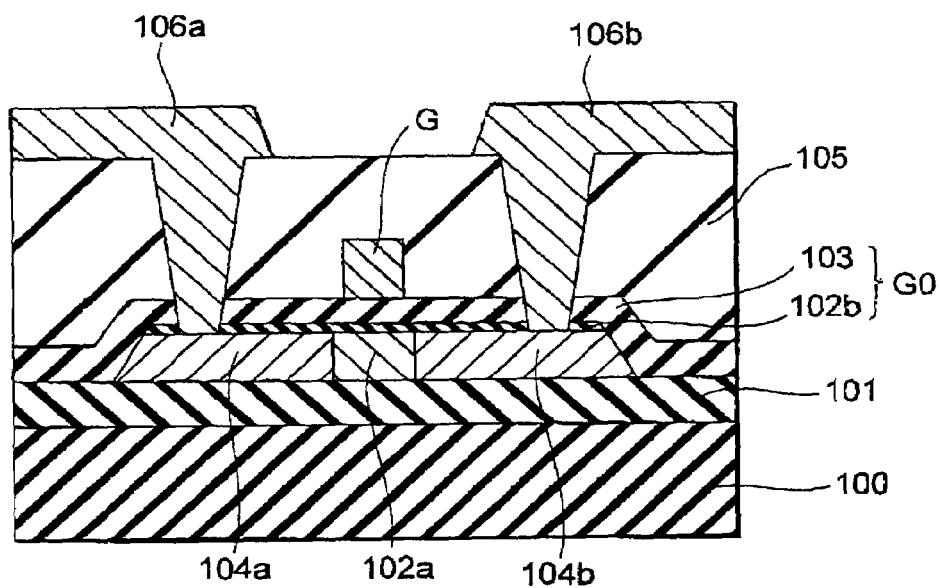
FIG. 19 is a cross-sectional view of the steps that represent a semiconductor device (TFT) fabrication method of a fabrication method 3.

FIGS. 18 and 19 are cross-sectional views of the steps representing the semiconductor device (TFT) fabrication method of fabrication method 3.

As shown in FIG. 18A, as per fabrication method 2, the base protection film 101 is formed on the glass substrate 100 and the silicon film 102, for example, is formed on the base protection film 101 as a semiconductor film.

Thereafter, hydrogen flame processing is performed on the silicon film 102 and the silicon is re-crystallized, whereby the polycrystalline silicon film 102a is produced. Thereupon, the silicon oxide film 102b is formed on the polycrystalline silicon film 102a.

Subsequently, as shown in FIG. 11B, a polycrystalline silicon film 102a and silicon oxide film 102b are patterned. Thereafter, as shown in FIG. 18C, a silicon oxide film 103, for example, is formed as an insulation film on the silicon oxide film 102b. The silicon oxide film 103 is formed by using plasma CVD with TEOS and oxygen gas and so forth, for example, serving as the source gas. The gate insulation film G0 is constituted by stacked films of the silicon oxide film 102b which is a thermally oxidized film and the silicon oxide film 103 which is a deposition film.

Thus, according to the above steps, the film thickness of the gate insulation film G0 can be easily adjusted as per fabrication method 2. Further, even when the gate insulation film G0 is constituted by stacked films, defects in the interface between the polycrystalline silicon film 102a and silicon oxide film 102b can be reduced by the hydrogen flame processing and the TFT characteristics can be improved. Further, the side walls of the polycrystalline silicon film 102a that is exposed when patterning the polycrystalline silicon film 102a can be covered by the silicon oxide silicon film 103.

Thereafter, as shown in FIG. 19, gate electrode G is formed on the gate insulation film G0 as per fabrication method 1. Source and drain regions 104a and 104b are then formed by implanting impurity ions in the silicon film 102 with the gate electrode G serving as a mask. Subsequently, the interlayer insulation film 105 is formed on the gate electrode G and source and drain electrodes 106a and 106b are formed. Thereafter, the steps of forming the interlayer insulation film and wiring may be repeated to form multilayered wiring. The TFT is substantially completed as a result of the above steps.

Thus, according to these steps, in addition to the results of fabrication method 1, the result that the film thickness of the gate insulation film G0 is easy to adjust is afforded. In addition, the side walls of the patterned polycrystalline silicon film 102a is covered by the silicon oxide film 103 and, therefore, even when the gate electrode traverses the side wall, the gate electrode and polycrystalline silicon film 102a do not short.

Further, so too with this fabrication method, the hydrogen flame processing for repairing defects may be performed via the interlayer insulation film 105 as per the fabrication method 2.

Fabrication Method 4

Figure 20:
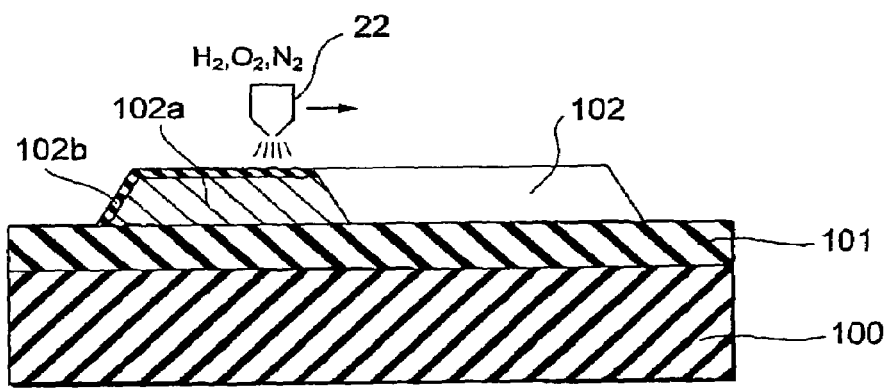
FIG. 20 is a cross-sectional view of the steps that represent a semiconductor device (TFT) fabrication method of a fabrication method 4.

Although hydrogen flame processing was performed by scanning the flame of a gas burner that uses a mixed gas of hydrogen and oxygen as fuel in fabrication methods 1 to 3, nitrogen ($N_2$) may be further added to the mixed gas to form an oxynitride film. FIG. 20 is a cross-sectional view of the steps representing the semiconductor device (TFT) fabrication method of fabrication method 4.

That is, as shown in FIG. 20, the hydrogen flame processing of the silicon film 102 is performed while applying nitrogen ($N_2$) to the mixed gas of hydrogen ($H_2$) and oxygen gas ($O_2$) by the gas controller 15 shown in FIG. 1, for example. As a result of this processing, the silicon film 102 is changed into the polycrystalline silicon film 102a and a silicon oxynitride film 102c is formed on the surface of the polycrystalline silicon film 102a. The other steps are the same as those of fabrication methods 1 to 3 and a detailed description thereof is omitted.

Thus, according to this fabrication method, a silicon oxynitride film 102c with a higher dielectric constant that is more compact can be formed on the polycrystalline silicon film 102a. The characteristics of the TFT can accordingly be improved.

The addition of nitrogen may be performed at the start of processing or and also during processing. Further, nitrogen may be introduced to the chamber (See FIG. 1) and an oxynitride film may be formed. That is, an oxynitride film may be formed by scanning the flame of the gas burner that uses a mixed gas of hydrogen and oxygen as its fuel in a nitrogen atmosphere. A gate insulation film may be constituted by stacked films of the oxynitride film and deposition film.

Fabrication Method 5

Although a thermally oxidized film that is formed during hydrogen flame processing of the silicon film was used as the gate insulation film of the TFT in fabrication methods 1 to 4, the thermally oxidized film may be used as part of another element. In this fabrication method, the oxynitride film is used as a capacitive insulation film.

FIG. 21 is a cross-sectional view of the steps representing the semiconductor device (capacitor) fabrication method of fabrication method 5.

Figure 21A:
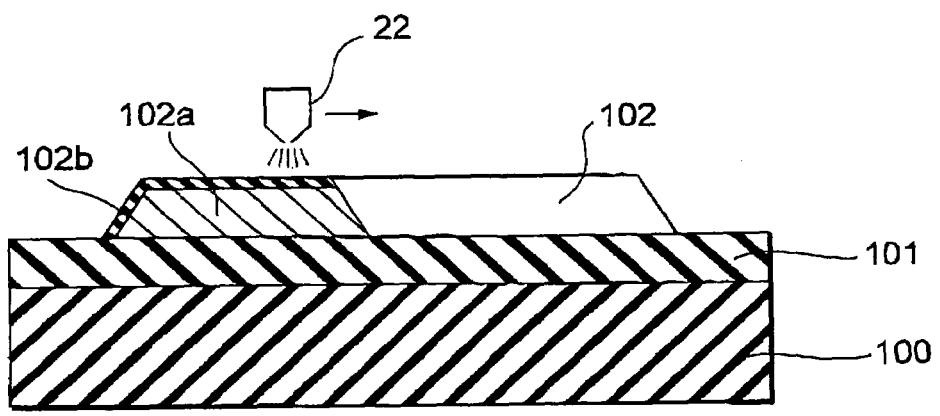
FIG. 21 is a cross-sectional view of the steps that represent a semiconductor device (capacity) fabrication method of a fabrication method 5.

As shown in FIG. 21A, the base protective film 101 is formed on the glass substrate 100 as per the fabrication method 2 and the silicon film 102, for example, is formed as the semiconductor film on the base protection film 101. Thereafter, after the silicon film 102 is patterned with the desired shape, hydrogen flame processing is performed and the silicon is re-crystallized to produce the polycrystalline silicon film 102a. Thereupon, the silicon oxide film 102b is formed on the polycrystalline silicon film 102a. The polycrystalline silicon film 102a is the lower electrode of the capacitor. Further, the silicon oxide film 102b is a capacitive insulation film.

Figure 21B:
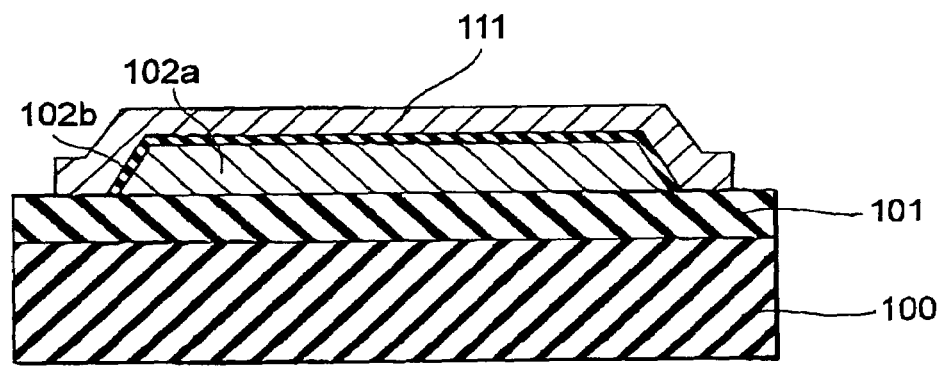

Thereafter, as shown in FIG. 21B, an Al or other metal material is formed by sputtering, for example, as an electrically conductive film 111 on the silicon oxide film 102b. The electrically conductive film 111 is then patterned with the desired shape and the upper electrode (111) of the capacitor is formed.

Subsequently, an interlayer insulation film and wiring and so forth are formed if required. Thus, a thermally oxidized film that is formed during hydrogen flame processing of the silicon film may be used as the capacitive insulation film.

Further, although only the thermally oxidized film was the capacitive insulation film in the above steps, a deposition insulation film may also be formed on this film and a capacitive insulation film may be constituted by stacked films of the thermally oxidized film and deposition insulation film.

Further, although hydrogen flame processing was performed after patterning the silicon film in the above steps, the silicon film may also be patterned after performing hydrogen flame processing on the silicon film. Patterning may also be performed after depositing the metal material that constitutes the upper electrode.

In addition, nitrogen may be introduced to the mixed gas during the hydrogen flame processing and the film formed may be an oxynitride film. In this case, the dielectric constant is larger than that of the oxide film. Further, a capacitive insulation film may also be constituted by the oxynitride film and deposition insulation film.

Further, although a thermally oxidized film or thermally nitrided film (102b) formed during recrystallization of the silicon film 102 was used as the gate insulation film or capacitive insulation film in fabrication methods 1 to 5, the thermally oxidized film or the like may be removed by etching or the like, hydrogen flame processing may be performed once again on the surface of the polycrystalline silicon film 102a and a thermally oxidized film (102b) or the like may be formed. The deposition insulation film may be formed by CVD or the like.

In addition, embodiments and application examples described by way of the above embodiments of the invention can be suitably combined in accordance with the application or modifications or improvements can be used. The present invention is not limited to the embodiments above.

3) Description of Electro-Optical Devices and Electronic Devices

A description will be provided next of an electro-optical device (electronic device) that uses a semiconductor device (TFT, for example) that is formed by methods described in the above embodiments.

The semiconductor device (TFT, for example) is used as a driving element of an electro-optical device (display device), for example. FIG. 22 shows an example of an electronic device that uses an electro-optical device. FIG. 22A is an application example in which the present invention is applied to a cellular phone and FIG. 22B is an application example in which the present invention is applied to a video camera. Further, FIG. 22C is an application example in which the present invention is applied to a television (TV) and FIG. 22D is an application example in which the present invention is applied to a rollup type television.

As shown in FIG. 22A, the cellular phone 530 comprises an antenna section 531, a voice output section 532, a voice input section 533, an operation section 534, and an electro-optical device (display section) 500. A semiconductor device that is formed by the present invention can be used (integrated) in the electro-optical device.

As shown in FIG. 22B, the video camera 540 comprises an image pickup section 541, operation section 542, speech input section 543, and electro-optical device (display section) 500 The semiconductor device formed by the present invention can be used (integrated) in the electro-optical device.

As shown in FIG. 22C, a television 550 comprises an electrooptical device (display section) 500. The semiconductor device that is formed by the present invention can be used (integrated) as the electro-optical device. Further, a semiconductor device that is formed by the present invention can be used (integrated) in the monitor device (electro-optical device) used in a personal computer or the like.

As shown in FIG. 22D, the rollup-type television 560 comprises an electro-optical device (display section) 500. The semiconductor device formed by the present invention can be used (integrated) in the electro-optical device.

Further, electronic devices that include electro-optical devices include a variety of devices in addition to those mentioned hereinabove, such as large screens, personal computers, portable information devices (so-called PDAs and electronic notebooks) and so forth and display function equipped fax machines, digital camera finders, portable TVs, electric bulletin boards, and advertising displays.

What is claimed is:

1. A semiconductor device fabrication method, comprising the step of:

thermally processing a semiconductor layer that is deposited on a substrate by using, as a heat source, the flame of a gas burner that uses a mixed gas of hydrogen and oxygen as fuel, wherein the semiconductor layer is re-crystallized by the thermal processing and an oxynitride film is formed on the surface of the semiconductor layer.

2. A semiconductor device fabrication method, comprising the steps of:

thermally processing a semiconductor layer that is deposited on a substrate by using, as a heat source, the flame of a gas burner that uses a mixed gas of hydrogen and oxygen as fuel such that the semiconductor layer is re-crystallized and an oxynitride film is formed on the surface of the semiconductor layer; and forming an electrically conductive film on the oxynitride film.

3. The semiconductor device fabrication method according to claim 2, wherein the thermal processing performed under the conditions is performed by including nitrogen in the mixed gas of hydrogen and oxygen, or performed under a nitrogen atmosphere.

4. The semiconductor device fabrication method according to claim 2, wherein the oxynitride film is a gate insulation film and the electrically conductive film is a gate electrode.

5. The semiconductor device fabrication method according to claim 2, wherein the oxynitride film is a capacitive insulation film and the electrically conductive film is a capacitive electrode.

6. The semiconductor device fabrication method according to claim 1, further comprising the steps of: removing the oxynitride film; and forming another insulation film on the surface of the semiconductor layer.

7. The semiconductor device fabrication method according to claim 1, wherein the thermal processing is performed by establishing an oxygen-rich mixed gas of hydrogen and oxygen.

8. The semiconductor device fabrication method according to claim 1, wherein the thermal processing is performed by establishing a hydrogen-rich mixed gas of hydrogen and oxygen after the thermal processing performed under the conditions, and further comprises thermal processing that performs reforming of the semiconductor layer and oxynitride film.

9. The semiconductor device fabrication method according to claim 1, wherein a step of patterning the semiconductor layer deposited on the substrate is performed by means of etching prior to the thermal processing step.

10. The semiconductor device fabrication method according to claim 1, wherein the thermal processing is performed by forming the flame of the gas burner as a linear flame and scanning the semiconductor layer relatively by means of the linear flame.

11. The semiconductor device fabrication method according to claim 1, wherein the temperature or pressure of the flame to which the semiconductor layer is exposed is adjusted by adjusting the distance between the gas burner and the substrate.

12. The semiconductor device fabrication method according to claim 1, wherein the pressure of the flame to which the semiconductor layer is exposed is adjusted by adjusting the attitude of the gas burner with respect to the substrate.

13. The semiconductor device fabrication method according to claim 1, wherein the gas burner is constituted comprising an air guide pipe that leads out mixed gas, and a shield device that comprises a combustion chamber that causes the mixed gas to combust by covering the air guide pipe and a nozzle section that emits the combustion gas.

14. The semiconductor device fabrication method according to claim 13, wherein a plurality of openings are formed at a fixed pitch in the air guide pipe and a flame is irradiated from the openings.

15. The semiconductor device fabrication method according to claims 1, wherein the temperature of the flame is adjusted by adding an inert gas to the mixed gas of hydrogen and oxygen.

16. The semiconductor device fabrication method according to claims 1, wherein the substrate and gas burner are disposed in a chamber, and the pressure in the chamber is adjusted by introducing an inert gas to the chamber.

17. The semiconductor device fabrication method according to claim 1, further comprising the step of heating the substrate before performing the thermal processing and/or during the processing.

18. An electronic device fabrication method, comprising:
the semiconductor device fabrication method according to claim 1.

* * * * *